US012586749B2

(12) United States Patent
Sarov et al.

(10) Patent No.: US 12,586,749 B2
(45) Date of Patent: Mar. 24, 2026

(54) CERTAIN IMPROVEMENTS OF MULTI-BEAM GENERATING AND MULTI-BEAM DEFLECTING UNITS

(71) Applicant: Carl Zeiss MultiSEM GmbH, Oberkochen (DE)

(72) Inventors: Yanko Sarov, Aalen (DE); Ulrich Bihr, Dirgenheim (DE); Hans Fritz, Grabs (CH); Dirk Zeidler, Oberkochen (DE); Georg Kurij, Ulm (DE); Ralf Lenke, Lauchheim (DE); András G. Major, Oberkochen (DE); Christof Riedesel, Aalen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 650 days.

(21) Appl. No.: 17/820,798

(22) Filed: Aug. 18, 2022

(65) Prior Publication Data

US 2022/0392734 A1 Dec. 8, 2022

Related U.S. Application Data

(63) Continuation of application No. PCT/EP2021/025095, filed on Mar. 9, 2021.

(30) Foreign Application Priority Data

Mar. 12, 2020 (DE) .......................... 102020106801.8

(51) Int. Cl.
*H01J 37/147* (2006.01)
*H01J 37/09* (2006.01)
(Continued)

(52) U.S. Cl.
CPC .......... *H01J 37/1472* (2013.01); *H01J 37/09* (2013.01); *H01J 37/12* (2013.01); *H01J 37/28* (2013.01);
(Continued)

(58) Field of Classification Search
None
See application file for complete search history.

(56) References Cited

U.S. PATENT DOCUMENTS 4,130,761 A 12/1978 Matsuda
4,153,843 A 5/1979 Pease
(Continued)

FOREIGN PATENT DOCUMENTS

DE 10 2014 008 083 A1 12/2015
EP 2 267 751 A2 12/2010
(Continued)

OTHER PUBLICATIONS

International Search Report and Written Opinion for corresponding PCT Appl No. PCT/EP2021/025095, dated Aug. 6, 2021.
(Continued)

*Primary Examiner* — James Choi
(74) *Attorney, Agent, or Firm* — Fish & Richardson P.C.

(57) ABSTRACT

Certain improvements of multi-beam raster units such as multi-beam generating units and multi-beam deflector units of a multi-beam charged particle microscopes are provided. The improvements include design, fabrication and adjustment of multi-beam raster units including apertures of specific shape and dimensions. The improvements can enable multi-beam generation and multi-beam deflection or stigmation with higher precision. The improvements can be relevant for routine applications of multi-beam charged particle microscopes, for example in semiconductor inspection and review, where high reliability and high reproducibility and low machine-to-machine deviations are desirable.

20 Claims, 19 Drawing Sheets

(51) Int. Cl.
*H01J 37/12* (2006.01)
*H01J 37/28* (2006.01)

(52) U.S. Cl.
CPC ................. *H01J 2237/0453* (2013.01); *H01J 2237/1516* (2013.01)

(56) References Cited

U.S. PATENT DOCUMENTS

| | | | |
|---|---|---|---|
| 4,200,794 A | 4/1980 | Newberry | |
| 4,338,548 A | 7/1982 | Bono | |
| 4,742,234 A | 5/1988 | Feldman | |
| 5,215,623 A | 6/1993 | Takahashi | |
| 5,864,142 A | 1/1999 | Muraki | |
| 5,892,224 A | 4/1999 | Nakasuji | |
| 5,905,267 A | 5/1999 | Muraki | |
| 5,981,954 A | 11/1999 | Muraki | |
| 6,107,636 A | 8/2000 | Muraki | |
| 6,124,599 A | 9/2000 | Muraki | |
| 6,137,113 A | 10/2000 | Muraki | |
| 6,323,499 B1 | 11/2001 | Muraki | |
| 6,333,508 B1 | 12/2001 | Katsap | |
| 6,617,595 B1 | 9/2003 | Okunuki | |
| 6,633,366 B2 | 10/2003 | De Jager | |
| 6,696,371 B2 | 2/2004 | Butschke | |
| 6,787,780 B2 | 9/2004 | Hamaguchi | |
| 6,804,288 B2 | 10/2004 | Haraguchi | |
| 6,818,911 B2 | 11/2004 | Tamamori | |
| 6,835,508 B2 | 12/2004 | Butschke | |
| 6,872,950 B2 | 3/2005 | Shimada | |
| 6,903,345 B2 | 6/2005 | Ono | |
| 6,903,353 B2 | 6/2005 | Muraki | |
| 6,917,045 B2 | 7/2005 | Hashimoto | |
| 6,919,574 B2 | 7/2005 | Hashimoto | |
| 6,943,349 B2 | 9/2005 | Adamec | |
| 6,953,938 B2 | 10/2005 | Iwasaki | |
| 6,992,290 B2 | 1/2006 | Watanabe | |
| 7,005,658 B2 | 2/2006 | Muraki | |
| 7,015,467 B2 | 3/2006 | Maldonado | |
| 7,060,984 B2 | 6/2006 | Nagae | |
| 7,084,411 B2 | 8/2006 | Lammer-Pachlinger | |
| 7,091,504 B2 | 8/2006 | Wieland | |
| 7,109,494 B2 | 9/2006 | Ono | |
| 7,126,141 B2 | 10/2006 | Ono | |
| 7,129,502 B2 | 10/2006 | Kruit | |
| 7,244,949 B2 | 7/2007 | Knippelmeyer | |
| 7,285,779 B2 | 10/2007 | Litman | |
| 7,332,730 B2 | 2/2008 | Heinitz et al. | |
| 7,375,326 B2 | 5/2008 | Sender | |
| 7,420,164 B2 | 9/2008 | Nakasuji | |
| 7,468,507 B2 | 12/2008 | Rogers | |
| 7,504,622 B2 | 3/2009 | Elyasaf | |
| 7,535,001 B2 | 5/2009 | Sender | |
| 7,601,972 B2 | 10/2009 | Nakasuji | |
| 7,619,203 B2 | 11/2009 | Elyasaf | |
| 7,696,497 B2 | 4/2010 | Rogers | |
| 8,035,082 B2 | 10/2011 | Yamazaki | |
| 8,134,135 B2 | 3/2012 | Kruit | |
| 8,350,214 B2 | 1/2013 | Otaki | |
| 8,362,425 B2 | 1/2013 | Han | |
| 8,384,051 B2 | 2/2013 | Ozawa | |
| 8,598,525 B2 | 12/2013 | Zeidler | |
| 8,618,496 B2 | 12/2013 | Wieland | |
| 8,704,192 B2 | 4/2014 | Sano | |
| 8,748,842 B2 | 6/2014 | Ohashi | |
| 8,779,399 B2 | 7/2014 | Yamanaka | |
| 8,829,465 B2 | 9/2014 | Tsunoda | |
| 8,963,099 B2 | 2/2015 | Yamada | |
| 9,153,413 B2 | 10/2015 | Almogy | |
| 9,263,233 B2 | 2/2016 | Zeidler | |
| 9,336,981 B2 | 5/2016 | Knippelmeyer | |
| 9,336,982 B2 | 5/2016 | Zeidler | |
| 9,349,571 B2 | 5/2016 | Kemen | |
| 9,368,314 B2 | 6/2016 | Nakasuji | |
| 9,530,613 B2 | 12/2016 | Rogers | |
| 9,536,702 B2 | 1/2017 | Lang | |
| 9,552,957 B2 | 1/2017 | Zeidler et al. | |
| 9,607,805 B2 | 3/2017 | Liu | |
| 9,653,254 B2 | 5/2017 | Zeidler | |
| 9,702,983 B2 | 7/2017 | Eder | |
| 9,922,799 B2 | 3/2018 | Li | |
| 9,991,089 B2 | 6/2018 | Mueller | |
| 10,062,541 B2 | 8/2018 | Ren | |
| 10,141,160 B2 | 11/2018 | Ren | |
| 10,354,831 B2 | 7/2019 | Kemen | |
| 10,388,487 B2 | 8/2019 | Zeidler | |
| 10,535,494 B2 | 1/2020 | Zeidler et al. | |
| 10,541,112 B2 | 1/2020 | Schubert | |
| 10,586,677 B1 | 3/2020 | Okada | |
| 10,600,613 B2 | 3/2020 | Zeidler | |
| 10,622,184 B2 | 4/2020 | Knippelmeyer | |
| 10,643,820 B2 | 5/2020 | Ren | |
| 10,741,355 B1 | 8/2020 | Zeidler et al. | |
| 10,811,215 B2 | 10/2020 | Zeidler | |
| 10,854,423 B2 | 12/2020 | Sarov | |
| 10,879,031 B2 | 12/2020 | Ren | |
| 10,896,800 B2 | 1/2021 | Riedesel | |
| 2001/0017739 A1* | 8/2001 | Krans .................... B82Y 10/00 |
| | | | 359/801 |
| 2003/0209673 A1* | 11/2003 | Ono .......................... H01J 9/18 |
| | | | 250/396 R |
| 2007/0080647 A1* | 4/2007 | Desieres ............... H01J 37/243 |
| | | | 315/169.3 |
| 2008/0283767 A1* | 11/2008 | Platzgummer ......... B82Y 40/00 |
| | | | 250/396 R |
| 2009/0014649 A1 | 1/2009 | Nakasuji | |
| 2009/0114818 A1* | 5/2009 | Casares ................... H01J 37/09 |
| | | | 250/306 |
| 2014/0091229 A1* | 4/2014 | Nomura ................. B82Y 40/00 |
| | | | 250/396 R |
| 2014/0151570 A1 | 6/2014 | Kato et al. | |
| 2014/0197325 A1 | 7/2014 | Kato | |
| 2015/0348738 A1 | 12/2015 | Zeidler et al. | |
| 2017/0133198 A1 | 5/2017 | Kruit | |
| 2019/0139739 A1 | 5/2019 | Goshima | |
| 2019/0259575 A1 | 8/2019 | Sarov et al. | |
| 2019/0333732 A1 | 10/2019 | Ren | |
| 2020/0152412 A1* | 5/2020 | Ren ..................... H01J 37/1477 |
| 2020/0211810 A1 | 7/2020 | Zeidler | |
| 2020/0243300 A1 | 7/2020 | Zeidler | |
| 2020/0373116 A1 | 11/2020 | Zeidler | |
| 2021/0005423 A1 | 1/2021 | Zeidler | |
| 2021/0035773 A1 | 2/2021 | Zeidler | |

FOREIGN PATENT DOCUMENTS

| | | |
|---|---|---|
| GB | 2519511 A | 4/2015 |
| GB | 2521819 A | 7/2015 |
| JP | 59184524 A | 10/1984 |
| JP | 60042825 A | 3/1985 |
| JP | 60105229 A | 6/1985 |
| JP | 61263217 A | 11/1986 |
| JP | 2004152504 A | 5/2004 |
| JP | 2012195368 A | 10/2012 |
| JP | 2014229481 A | 12/2014 |
| WO | WO 2005/024881 A2 | 3/2005 |
| WO | WO2013032949 A1 | 3/2013 |
| WO | WO2020057678 A1 | 3/2020 |
| WO | WO2020064035 A1 | 4/2020 |
| WO | WO2020065094 A1 | 4/2020 |
| WO | WO2020070074 A1 | 4/2020 |
| WO | WO2020151904 A2 | 7/2020 |
| WO | WO2020249147 A1 | 12/2020 |

OTHER PUBLICATIONS

Japanese Examination Report, with translation thereof, for corresponding JP Appl No. 2022-554653, dated Nov. 26, 2024.
Office Action in Taiwanese Appln. No. 110108745, mailed on Jun. 4, 2025, 5 pages (with English translation).

(56)     References Cited

OTHER PUBLICATIONS

Office Action in Korean Appln. No. 10-2022-7034821, mailed on
Jul. 17, 2025, 6 pages (with English translation).

* cited by examiner

<u>FIG.9</u>

CERTAIN IMPROVEMENTS OF MULTI-BEAM GENERATING AND MULTI-BEAM DEFLECTING UNITS

CROSS-REFERENCE TO RELATED APPLICATIONS

The present application is a continuation of, and claims benefit under 35 USC 120 to, international application PCT/EP2021/025095, filed Mar. 9, 2021, which claims benefit under 35 USC 119 of German Application No. 10 2020 106 801.8, filed Mar. 12, 2020. The entire disclosure of these applications are incorporated by reference herein.

FIELD

The disclosure relates to multi-beam raster units such as multi-beam generating units and multi-beam deflector units of a multi-beam charged particle microscopes.

BACKGROUND

WO 2005/024881 A2 discloses an electron microscope system which operates with a multiplicity of electron beamlets for the parallel scanning of an object to be inspected with a bundle of electron beamlets. The bundle of electron beamlets is generated by directing a primary electron beam onto a first multi-aperture plate, which has a multiplicity of openings. One portion of the electrons of the electron beam is incident onto the multi-aperture plate and is absorbed there, and another portion of the beam transmits the openings of the multi-aperture plate and thereby in the beam path downstream of each opening an electron beamlet is formed whose cross section is defined by the cross section of the opening. Furthermore, suitably selected electric fields which are provided in the beam path upstream and/or downstream of the multi-aperture plate cause each opening in the multi-aperture plate to act as a lens on the electron beamlets passing the opening so that each electron beamlet is focused in a surface which lies at a distance from the multi-aperture plate. The surface in which the foci of the electron beamlets are formed is imaged by downstream optics onto the surface of the object or sample to be inspected. The primary electron beamlets trigger secondary electrons or backscattered electrons to emanate as secondary electron beamlets from the object, which are collected and imaged onto a detector. Each of the secondary beamlets is incident onto a separate detector element so that the secondary electron intensities detected therewith provide information relating to the sample at the location where the corresponding primary beamlet is incident onto the sample. The bundle of primary beamlets is scanned systematically over the surface of the sample and an electron microscopic image of the sample is generated in the usual way for scanning electron microscopes. The resolution of a scanning electron microscope is limited by the focus diameter of the primary beamlets incident onto the object. Consequently, in general, in multi-beam electron microscopy all the beamlets should form the same small focus on the object.

It is understood that the system and method illustrated in WO 2005/024881 in great detail at the example of electrons is very well applicable in general to charged particles. Typically, multiple beamlets for a multi-beam, charged particle microscope (MCPM) are generated in a multi-beam generating unit. Multi-beam charged particle microscopes (MCPM) commonly use both micro-optical (MO) elements and macroscopic elements in a charged particle projection system.

Multi-beam generating units usually comprise elements for splitting, partially absorbing, and influencing a beam of charged particles. As a result, a set of beamlets of charged particles in a predefined raster configuration is generated. Multi-beam generating units often comprise micro-optical elements, such as the first multi-aperture plate, further multi-aperture plates and micro-optical deflection elements, and macroscopic elements, such as lenses, in a special element design and special arrangement.

A multi-beam generating unit can be formed in an assembly of two or more parallel planar substrates or wafers, for example created by silicon micro structuring. During use, a plurality of electrostatic optical elements is formed by aligned apertures in at least two of such planar substrates or wafers. Some of the apertures may be equipped with one or more vertical electrodes, arranged with axial symmetry around the apertures, creating for example electrostatic lens arrays. The optical aberrations of such electrostatic lens arrays are known to be highly sensitive to the manufacturing inaccuracies of the plurality of apertures. The roughness of each aperture contour or edge can cause astigmatism and higher order aberrations. The inner surface of the electrostatic lens is usually formed in Silicon by vertical anisotropic etching with an inner surface having a roughness of typically between 100 nm and 500 nm.

For generation of predefined electrostatic optical elements, it is generally desirable to precisely control the plurality of electrodes, for example the geometry of the electrodes and the lateral alignment with respect to each beamlet of a plurality of charged particle beamlets, as well the distances between the electrodes in direction of a transmitting plurality of charged particle beamlets. Deviations in the fabrication processes of planar substrates, the electrodes and the assembly of planar substrates generate aberrations of the electrostatic optical elements and cause aberrations such as aberrations of the individual beamlets or deviations from the predefined raster configuration of the beamlets. Further, deviations in the fabrication process generate scattered particles, which deteriorate the image quality of the MCPM.

In general, with the current fabrication process the diameters of the apertures of the multi-beam generating unit may vary from aperture to aperture in one wafer, or from wafer to wafer. For example, the roughness can be increased by the inhomogeneity of the isotropic etch step, causing aberrations and image blurring in conventional multi-aperture plates. Aberrations of an upper aperture edge, which is responsible for generation of the plurality of beamlets from the incident charged particle beam, can be increased by fabrication processes of the prior art, thus exhibits significant inhomogeneity from beam to beam. Further, deviations in the fabrication process can generate deviations between several individual multi-beam generating units used in several different individual MCPMs. Such differences, also called machine-to-machine deviations, are usually unwanted for many applications of MCPMs.

With the current adjustment process the lateral alignment of the two or more parallel planar substrates or wafers to form a multi-beam generating or multi-beam deflecting unit is often not as precise as may be desired. The electrostatic optical elements formed during use between at least two planar substrates often involve a very precise lateral alignment of the at least two planar substrates or wafers.

Increased imaging performance and lower machine-to-machine deviations often involve lateral alignment below 0.5 μm.

Multi-aperture plates generally comprise thin membranes, fabricated for example from wafers by thinning processes. The deformation of membranes, generated during fabrication or induced e.g. by thermal expansion, can cause different distances between several multi-aperture plates and thus a difference in the plurality of electrostatic elements formed during use between at least two multi-aperture plates. A change of deformation of membranes can further introduce a deviation of a field curvature of the plurality of focus points of the beamlets, or a deviation of telecentricity properties of the plurality of beamlets.

Approaches for improving the theoretical performance of multi aperture arrays have been considered. For example, US 2003/0209673 A1 discloses an approach to reduce crosstalk between the plurality of primary charged particle beamlets. US 2003/0209673 A1 discloses an electrostatic Einzel lens array for a plurality of electron beamlets with reduced cross talk. The electrostatic Einzel lens array is arranged in an electron beam path downstream of an aperture array and comprises an upper electrode, middle electrodes and a lower electrode of the Einzel lenses, wherein each pair of electrodes is spaced apart by a large distance of 100 μm. Crosstalk is reduced by shielding electrodes, provided between upper electrode and middle electrodes and middle electrodes and lower electrode. In another example, an approach for reducing design aberrations is considered. DE 10 2014 008 083 A1, filed on May 30, 2014 or corresponding U.S. Pat. No. 9,552,957 B2 shows an example of a multi-aperture plate comprising an array of lenses with reduced spherical aberration. A reduction of design aberrations is achieved by lens apertures being larger compared to a beam diameter. DE 10 2014 008 083 A1 proposes a distance between multi-aperture plates in a range of 0.1 to 10 times of aperture diameters to avoid a charging effect on the electrodes, yet alone this large range has turned out to generally be not sufficient to prevent unwanted charging effects of electrodes from scattered charged particles.

SUMMARY

It is a task to minimize aberrations in a multi-beam raster unit such as a multi beam generating or multi-beam deflecting unit. It is a task to provide multi-beam generating units capable to form well defined beamlets with small focus point diameters, with minimal residual aberrations, in the predefined raster configuration and thereby generating as less as possible scattered particles during use. It is a task to provide multi-beam deflecting units capable to deflect beamlets with high precision without introducing or increasing aberrations of the beamlets and thereby generating as less as possible scattered particles during use.

It is a task to provide a design of a multi-beam raster unit such as a multi beam generating or multi-beam deflecting unit which is less sensitive to deviations and does not significantly introduce or increase aberrations and generates less scattered particle, and which allows fabrication of a multi beam generating or multi-beam deflecting unit with high repeatability.

It is a task to provide multi-beam raster units comprising at least two multi-aperture plates, including to provide fabrication process for the multi-aperture plates which is less sensitive to deviations, generates low aberrations and less scattered particles, and which allows fabrication of a multi beam generating or multi-beam deflecting unit with high stability and repeatability.

The present disclosure proposes a charged particle beam system which operates with a multiplicity of charged particle beams and can be used to achieve relatively high imaging performance, such as a better resolution and narrower range of resolution for each beamlet of the plurality of beamlets.

The present disclosure discloses a structural approach to mitigate fabrication errors in order to improve the beam quality of the plurality of beamlets, such as a reduction of the roughness of inner sidewalls to reduce scattering of transmitting electrons, or a selection of diameters and distances of apertures for a reduction of the impact of fabrication errors of the electrodes of electrostatic elements.

In some embodiments of the disclosure, a multi-beam raster unit is configured in a way to reduce the influence of deviations of the apertures from a predefined shape. A multi-beam raster unit according to the embodiments comprises a first multi aperture plate provided with a smooth, well defined conductive surface at the bottom side, acting as an opposite electrode for the formation of an electrostatic element with the subsequent, second multi-aperture plate. The multi-beam raster unit, such as a multi-aperture unit or a multi-beam deflector or multi-beam stigmator, is configured for forming during use a plurality of electrostatic elements for influencing a plurality of transmitting beamlets of charged particles. The multi-beam raster unit is configured such that edges and the inner sidewalls of apertures are situated with a larger distance to the transmitting beamlets of charged particles, and therefore the impact of deviations of edges of electrodes and inner sidewalls of apertures on the beam properties is minimized by a factor of 10 or more. The task is achieved by a multi aperture plate with apertures of special geometry and special shape.

In some embodiments, a design and fabrication method of a multi aperture plate is given which minimizes deviations of the apertures from a predefined shape, such that the apertures have well defined, clear and smooth shapes (surface and edges) with low roughness values and no local errors or deviations.

The multi-beam raster unit according to some embodiments comprises a first multi-aperture plate having an inner zone forming a membrane with a first thickness $L1$ with a plurality of first apertures, a beam entrance side and a beam exit side. The membrane of the first multi aperture plate comprises at least a first segment, having a first segment thickness $L1.1$ with a plurality of cylindrical apertures having a first diameter $D1$ at the beam entrance side and a second segment with the plurality of apertures having a second diameter $D2$ at the beam exit side. The multi-beam raster unit further comprises a second multi-aperture plate having an inner zone forming a membrane with a plurality of second apertures, and a beam entrance side, with the plurality of apertures having a third diameter $D3$ at the beam entrance side, the first and second multi-aperture plates forming a gap with a thickness $L2$ between the membranes of the first and second multi-aperture plate. The multi-beam raster unit further comprises at least a first electrode configured in proximity to a first aperture of the first multi-aperture plates at the beam exit side of the first multi-aperture plate, and at least a plurality of second electrodes configured in proximity to the plurality of second apertures of the second multi-aperture plate at the beam entrance side of the second multi-aperture plate, for forming during use the plurality of electrostatic elements between the pluralities of first and second apertures of the first and second multi-aperture plates. The multi-beam raster unit is configured with the second diameter $D2$ being larger than the first diameter $D1$, the second diameter $D2$ being in a range between second thickness $L2$ and two times the second thickness $L2$, thus $L2<D2<2*L2$. And wherein the first segment thickness $L1.1$ is smaller than 10 μm, such as smaller than 5 μm. In an example, in direction of the plurality of transmitting beamlets of charged particles, the first multi-aperture plate is arranged in the beam-path upstream the second multi-aperture plate and forms the upper or entrance multi-aperture plate of the multi-beam raster unit. In an example, in direction of the plurality of transmitting beamlets of charged particles, at least a third multi-aperture plate is arranged in the beam-path upstream the first and the second multi-aperture plate.

In some embodiments, at least a segment of the inner wall of an aperture in a second segment has a surface shape sloping away from a transmitting beamlet of charged particles. In some embodiments, the surface shape is curved and sloping away from a transmitting beam of charged particles. In some embodiments, a surface shape in direction of the transmitting beamlets of charged particles is of spherical shape. In some embodiments, an inner sidewall surface of at least one aperture of the plurality of apertures in the second segments has a surface shape such that the diameter of an aperture opening continuously increases with increasing z-coordinate. In some embodiments, the spherical shape is formed by isotropic etching.

In some embodiments, the first multi-aperture plate comprises an absorbing layer on the beam entrance side, wherein during use the absorbing layer is connected to a ground level. During use, a large part of the incident electrons is absorbed in the absorbing layer and an electrical current corresponding to the number of absorbed electrons is generated. For example, with $D1=30$ μm and the pitch between adjacent apertures being 150 μm, about 97% of the incident electrons from the incident electron beam are absorbed and a high current of electrons is generated. The absorbing layer can therefore show during use a fluctuating voltage difference corresponding to the induced current and is therefore not suited to form an electrode for an electrostatic element.

In some embodiments, the first multi-aperture plate comprises a conductive layer on the beam exit side, the conductive layer forming the first electrodes. The conductive layer basically can completely cover the beam exit surface of the first multi-aperture plate with only the aperture holes themselves being uncovered. However, it is also possible that only a part of the beam exit side is covered by the conductive layer. According to some embodiments, the conductive layer forms the first electrodes as passive or counter electrodes to driven second electrodes.

In some embodiments, the beam exit side of the first multi-aperture plate comprises ring-shaped conductive layers or electrodes around or in proximity to the apertures of diameter $D2$, which during use are connected to a constant voltage potential, the ring-shaped conductive layers or electrodes forming the first electrodes. The ring-shaped conductive layers or electrodes can form the first electrodes as passive or counter electrodes to driven second electrodes.

In some embodiments, the beam exit side of the first multi-aperture plate does not comprise a shielding electrode. According to the disclosure, it is not necessary to apply such a shielding electrode for reducing crosstalk.

In some embodiments, the second multi-aperture plate comprises ring-shaped electrodes arranged around the second apertures, wherein during use a drive voltage is applied to the ring-shaped electrodes, the ring-shaped electrodes forming the second electrodes.

In some embodiments, the ring-shaped electrodes basically extend through the second multi-aperture plate. They can totally extend through the second multi-aperture plate from the beam entrance side to the beam exit side.

In some embodiments of the disclosure, a multi aperture plate of a multi-beam raster unit is configured with etch stop rings around a plurality of apertures, for example the apertures of the beam exit side of the first multi-aperture plate or the beam entrance side of the second multi-aperture plate. With etch stop rings, a high precision of the shape and roughness of the aperture openings in the entrance or exit surface of a multi-aperture plate can be achieved. A fabrication process for a multi aperture plate with etch stop rings is provided.

In some embodiments, the surface roughness of an inner sidewall surface of at least one aperture of the plurality of apertures in a segment is below 50 nm rms, such as below 25 nm rms, for example below 10 nm rms. A fabrication method of apertures with roughness of inner sidewalls below 50 nm rms, such as below 25 nm rms, for example below 10 nm rms is provided.

The diameter $D1$ of the upper edge has, in general, in multi-beam generating units the function to stop and shape the charge particle beams. In some embodiments, the diameter $D1$ is in a range of $10$ μm$\leq D1\leq30$ μm, while the average aperture diameter and the diameter $D2$ of a lower or beam exit edge is larger than $D1$ for optimal performance of electrostatic elements. In an example, the second diameter $D2$ is in a range between first thickness $L1$ and two times the first thickness $L1$, thus $L1<D2<2*L1$. In an example, the second diameter $D2$ is in a range between the first segment thickness $L1.1$ and two times the first segment thickness, thus $L1.1<D2<2*L1.1$. In an example, the second diameter $D2$ is in a range between second thickness $L2$ and two times the second thickness $L2$, thus $L2<D2<2*L2$. In an example, the third diameter $D3$ is larger than the first diameter $D1$, for example the third diameter $D3$ is in a range between the first diameter $D1$ and the second diameter $D2$, thus $D1<D3<D2$.

In some embodiments, a fabrication method is provided for a multiple aperture plate with edges of electrodes and inner sidewalls of apertures situated with a larger distance to the transmitting beamlets. A micro-structuring process for a multi aperture plate of a multi-beam raster unit with apertures of special shape, for example curved shape, is provided. The multiple aperture plate can be fabricated by double-sided processing in a homogeneous planar substrate or in one composite substrate (e.g. SOI—silicon on isolator) wafer. In some embodiments, a fabrication method for double sided processing for high precision fabrication of the aperture openings in the entrance side as well as in the exit side of a multi-aperture plate is provided.

In some embodiments, the multi-beam raster unit comprises a first multi-aperture plate and a second multi-aperture plate with at least two segments. In an example, a second multi-aperture plate comprises a first and a second segment, separated by an isolation and etch stop layer. The first segment can comprise a plurality of electrodes formed around a plurality of apertures to form during use a plurality of electrostatic elements. The second segment can have a large thickness of $L7$ between 100 μm to 400 μm with aperture diameters $D7$ equal or larger than the aperture diameters $D3$ in the first segment. The second segment can provide a shield around the electrostatic field and improves performance of the plurality of electrostatic elements.

In some embodiments, the multi-beam raster unit comprises a second multi-aperture plate with a first and a second segment and a third segment, each separated by an isolation and etch stop layer. The first segment comprises a plurality of electrodes formed around a plurality of apertures to form during use a plurality of electrostatic elements. The second segment can have a large thickness of L7 between 100 µm to 400 µm with aperture diameters D7 equal or larger than the aperture diameters D3 in the first segment. The second segment can provide a shield around the electrostatic field and improves performance of the plurality of electrostatic elements. The third segment can be arranged between the first and the second segment and has apertures formed in conjunction with the apertures of the first segment to minimize the effect of alignment errors due to double sided processing the second multi-aperture plate. The thickness L8 of the third segment can be smaller or equal compared to the thickness L3 of the first segment.

In some embodiments, the beam entrance side of the second multi-aperture plate is covered by a shielding layer with at least one plunging extension into at least one of the apertures of the second multi-aperture plate.

In some embodiments, the influence of deviations to the optical performance is reduced by functional separation between the upper edge of the multi aperture plate, which acts as beam stop and forms the beam, and the lower edge of the multi aperture plate, which forms the electrostatic lens with the subsequent second micro-optical raster element. In an example, a first multiple aperture plate comprises two or more separate planar segments or substrates, each prepared separately by single-sided or double-sided structuring, which are assembled together to form a composite first multi aperture plate. Thus, a higher definition of the size, position and low roughness of both edges can be provided. The first and the second segment can be separate segments attached to each other. The multiple aperture plate can be realized by alignment and fixing together of the segments, e.g. by bonding, gluing, or to be fixed to a special holder for mutual alignment and adjustment which allow fine passive or active alignment and to keep the multiple aperture plate in the aligned state. In the example of active alignment, the substrates are adjustable with actuators formed between the separate substrates. The diameter D1 of the upper edge, with the function to stop and shape the charge particle beams can be given in a range of 10 µm≤D1≤30 µm, the diameter D2 of a lower or beam exit edge is larger for optimal performance of electrostatic elements.

In some embodiments, a fabrication method for a multiple aperture plate of a multi-beam raster unit comprising two or more separate segments is provided. The separated segments can be fabricated by double sided processing in a homogeneous planar substrate or in one composite substrates (e.g. SOI—silicon on isolator) wafers.

In some embodiments, the multi-beam raster unit comprises a holder for mutual alignment and adjustment of the at least first and second multi-aperture plates. In some embodiments, a multi-aperture plate with a membrane zone comprising a first, a second and a third segment is provided. The third segment includes different material or material composition and is in between the first and second segment and forms an etch stop and isolation layer. In some embodiments, a fabrication method of a multi-aperture plate with a membrane zone comprising three segments is provided. In an example, an inner sidewall of at least one of the plurality of apertures in the second segment has a curved shape.

In some embodiments, the multi-beam raster unit comprises a multi-aperture plate with an inner zone forming a membrane is formed from a SOI-Wafer with at least three layers in the sequence silicon, silicon-dioxide, silicon. In an example, the multi-aperture plate with an inner zone forming a membrane is formed from a SOI-Wafer with five layers in the sequence silicon, silicon-dioxide, silicon, silicon-dioxide, silicon.

In some embodiments, a structure and a method to adjust deformations of multi-aperture-plates are provided. At least the membrane of one multi-aperture plate comprises a layer of predetermined thickness, the layer induces a stress induced deformation of the membrane.

In some embodiments, a multi-beam raster unit comprises at least a first and a second multi-aperture plate forming an inner or membrane zone and a support zone for mutual attachment of the multi-aperture plates. In an example, a first multi-aperture plate comprises an inner zone of diameter O4, and a support zone. A support zone of the second multi-aperture plate can be attached to the inner zone or membrane zone of the first multi-aperture plate and forms in direction of the transmitting plurality of charge particle beamlet a z-distance between the membrane zones of the first and second multi-aperture plates below 50 µm, such as below 30 µm, for example below 20 µm. In an example, the multi-beam raster unit comprises a multi-aperture plate with a thick membrane of thickness between 100 µm and 500 µm.

In some embodiments, structures for a 3D alignment of a multi-beam raster unit comprising at least two multi-aperture-plates are provided. The multi-aperture plates each further can comprise a support zone with thickness >100 µm, or >50 µm, with maximal deviation of the thickness less than 10%. The multi-aperture plates can further comprise through-apertures with different aperture diameters A1 and A2 for mutual alignment of the first and second multi-aperture plates. In an example, the multi-beam raster unit has in direction of the transmitting plurality of charge particle beamlet an additive thickness ZU as a result of stacking a plurality of at least three multi-aperture plates, and a z-distance of through-apertures of ZA, whereby ZA is smaller than ZU, to enable mutual alignment of the multi-aperture plates. In some embodiments, at least one multi-aperture plate comprises an abatement or lowering at a first through-aperture to form a z-distance to a corresponding through-aperture of neighboring multi-aperture plate with a z-distance below 30 µm to enable mutual alignment of the multi-aperture plates. In an example, multi-beam raster unit comprises at least two alignment axes for mutual alignment of at least two pairs of multi-aperture plates, comprising at least two abatements or lowerings at the first and second through-apertures, each forming a z-distance to a corresponding through-aperture of neighboring multi-aperture plate with a z-distance below 30 µm to enable mutual alignment of the pairs of multi-aperture plates.

In some embodiments, the plurality of transmitting beamlets propagates through a plurality of apertures of a plurality of multi-aperture plates in a first direction, high voltage supply wiring connections are provided to first electrodes in at least one of the multi-aperture plates from a second direction perpendicular to the first direction, and low voltage supply wiring connections are provided to second electrodes in at least one of the multi-aperture plates from a third direction perpendicular to the first and second direction.

In some embodiments, a multi-beam charged particle microscope comprises a multi-beam raster unit according one of the embodiments.

BRIEF DESCRIPTION OF THE DRAWINGS

Embodiments of the present disclosure will be explained in more detail with reference to drawings, in which.

DESCRIPTION OF EXEMPLARY EMBODIMENTS

Figure 1:
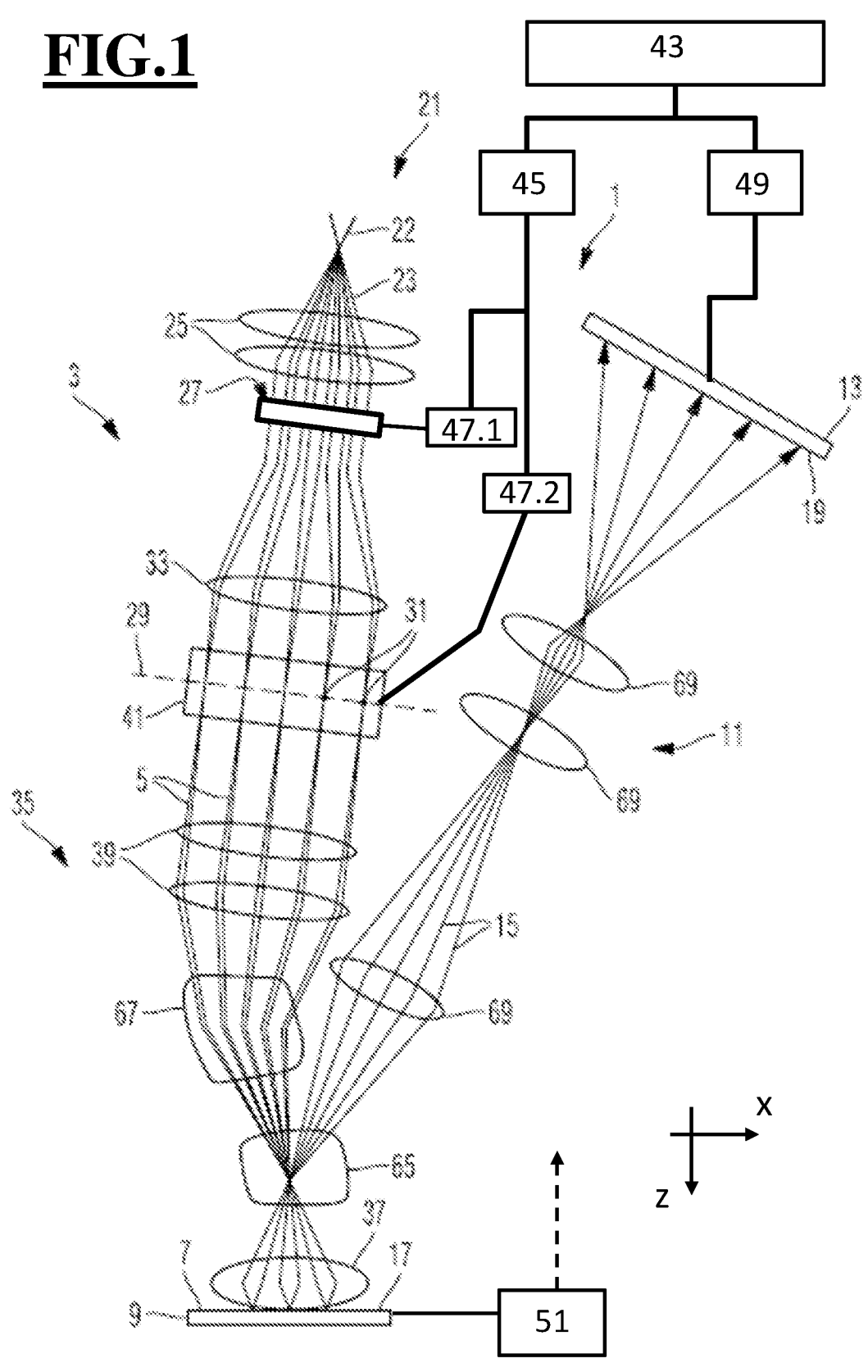
FIG. 1 is a schematic sectional view of a multi-beam charged particle microscope according to an embodiment.

A multi-beam charged particle microscope (MCPM) of one embodiment is illustrated in FIG. 1. The charged particle system 1 comprises an illumination system 3. The illumination system 3 is configured to focus a set of beamlets of charged particles 5 in an image plane 7. In the image plane 7, a sample 9 can be placed on a sample stage with actuators (not shown) to allow to precisely position the sample 9 in the image plane 7 with five or more degrees of freedom. The set of beamlets 5 comprises several beamlets of charged particles in a raster configuration, for example in a hexagonal raster or beamlets distributed on a circle. The number of beamlets can be 10 to 10000 or more, typical examples of a hexagonal raster configuration comprise for example more than 90 beamlets. Each beamlet of the set of beamlets 5 is focused on the sample 9 in one spot. The spot distance in the image plane 7 (on the object 9) is typically 5 µm-15 µm, but other distances of e.g. 1 µm-200 µm are possible. For high resolution, the illumination system 3 is configured for generating small spot diameters, for example below 5 nm, below 3 nm or even below 1 nm. The set of beamlets of charged particles 5 can comprise electron beamlets, but other charged particles are possible as well. The charged particles interact with the sample 9 and secondary charged particles are generated, including secondary electrons and backscattered charged particles. The secondary charged particles from each spot together form a set of beamlets of secondary charged particles 15. An imaging system 11 is configured to collect at least some of the secondary charged particles and focuses the set of beamlets of secondary charged particles 15 into a detector plane 19. An imaging system 35 of the illumination system 3 and the projection system 11 in the beam path of the secondary charged particles leading from the image plane 7 to a detector plane are configured such that the image plane 7 of imaging system 35 coincides with the object plane 17 of the imaging system 11. The imaging system 35 of the illumination system 3 comprises a global deflection unit 67. Imaging systems 35 and 11 are combined by a beam splitting and combining unit 65. An objective system 37 is in the common imaging path to both imaging systems 11 and 35. Imaging system 11 further comprises additional imaging elements 69. In the detector plane 19, a spatially resolving charged particle detector 13 is arranged. For each of the beamlets of secondary charged particles 15 the spatially resolving charged particle detector 13 detects with at least one detector element secondary charged particles of the beamlet.

The illumination system 3 comprises a source unit 21 to generate the set of beamlets of charged particles 5. A multi-beam generating unit is for example explained in U.S. application Ser. No. 16/277,572, publication number US 2019/0259575, and in U.S. application Ser. No. 16/266,842, filed on Feb. 4, 2019, both hereby incorporated by reference.

Figure 2:
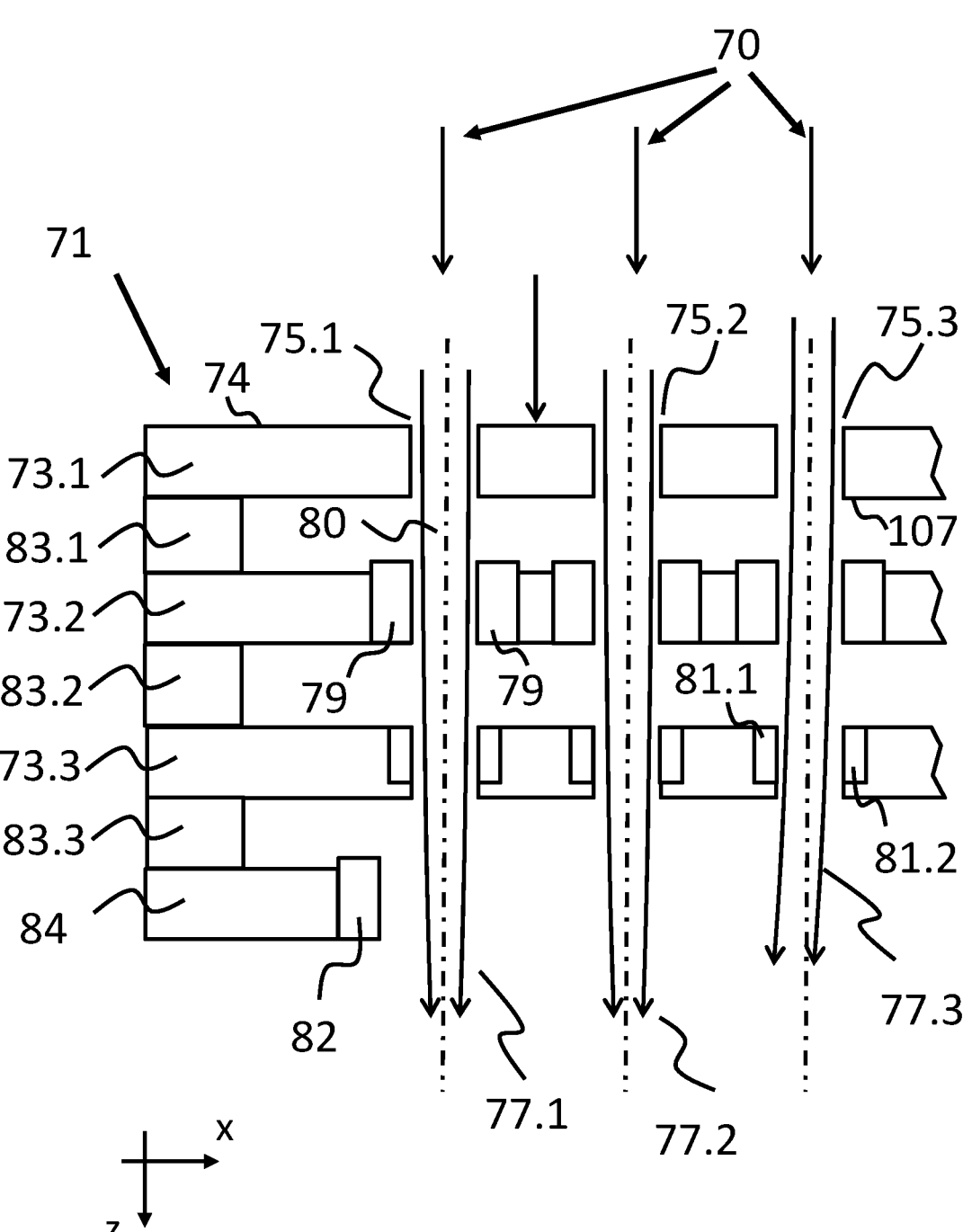
FIG. 2 shows an inner zone or membrane part of a multi-beam raster unit according an embodiment.

The source unit 21 comprises a charged particle emitter 22, which generates a diverging beam of charged particles 23. A condenser system 25 collimates the beam 23 onto a multi aperture arrangement 27. The multi aperture arrangement 27 comprises a first multi aperture plate with a plurality of apertures and micro-optical raster elements. The multi aperture arrangement 27 transforms the beam 23 into the set of beamlets of charged particles 5. The set of beamlets of charged particles 5 is focused into an intermediate focus surface 29, in which for each of the beamlets of charged particles 5 a focus 31 is formed. The focusing is achieved by micro-optical raster elements of the multi aperture arrangement 27 in combination with the collimation power of the condenser system 25 and optional additional imaging elements 33. Then intermediate focus surface 29 can be curved to compensate a field curvature of the imaging system 35. Imaging system 35 images the intermediate focus surface 29 into the image plane 7. Imaging system 35 comprises the objective system 37 and further imaging elements 39. The illumination system 3 is configured to focus the set of beamlets 5 onto the sample 9, such that the set of beamlets 5 form a telecentric bundle of beamlets, in which each beamlet inclines perpendicular to the image surface 7, in which sample 9 is arranged. In order to achieve the telecentric set of beamlets 5, a multi-beam deflector unit 41 is arranged in the intermediate image surface 29. The deflector unit 41 comprises micro-optical raster elements, which are configured as an array of deflectors to individually adjust the propagation angles for each beamlet of the set of beamlets 5. Multi-beam raster units like the multi-beam generating unit 27 or multi-beam deflector unit 41 comprise a plurality multi-aperture plates or micro-optical raster elements formed in planar substrates or wafers. A representative multi-beam raster unit 71 comprising three multi-aperture plates 73.1, 73.2, 73.3 is illustrated in FIG. 2. FIG. 2 shows a part of the inner zone or membrane zone of the multi-aperture plates 73.1, 73.2, 73.3. For example, a first multi-aperture plate 73.1 is configured with a set of openings or apertures 75.1, 75.2, 75.3. The set of apertures may be arranged in different raster configurations, for example in a hexagonal raster, or for example in a circular arrangement. In an example, the multi-aperture plate is configured to generate the set of multiple electron beamlets 77.1, 77.2, 77.3 from an incident single electron beam 70. In this configuration, an incident single electron beam 70 passes the apertures and thereby multiple electron beamlets 77.1, 77.2, 77.3 in a raster configuration are formed. In another example, for example in a multi-beam deflecting unit, a first multi-aperture plate 73.1 is configured to transmit a pre-shaped set of electron beamlets 77.1, 77.2, 77.3, and comprises apertures 75.1, 75.2, 75.3 in the raster configuration of the pre-shaped set of electron beamlets. In each example, at least one of the plurality of electron beamlets 77.1, 77.2, 77.3 passes or transmits a corresponding aperture 75.1, 75.2, 75.3 of a micro-optical raster element 73.1.

The multi-beam raster unit comprises second micro-optical raster elements 73.2, 73.3 in proximity either upstream or downstream of the multi-aperture plate 73.1 in direction of the incident electron beam 70. Each second micro-optical raster element 73.2, 73.3 comprises a similar or identical set of apertures in the raster configuration as the multi-aperture plate 73.1 and a set of electrostatic elements which is configured to influence individually and independently each beamlet of the set of electron beamlets. For example, the electrostatic lens element 80 is generated as an electrostatic field (not shown) by application of a drive voltage to a ring-shaped electrode 79, which is arranged around an aperture of the micro-optical raster element 73.2, and the lower or bottom side 107 of the first multi aperture plate 73.1, which acts as opposing electrode. During use, the electrostatic lens element 80 focusses the beamlet 77.1 into focus plane 29 (see FIG. 1). Other examples of electrostatic elements are multipole elements, for example comprising four or eight electrodes 81.1, 81.2 (only two are shown) centered around an aperture in a third micro optical raster element 73.3 to correct individually and independently the shape of beamlets 77.3 or serve as deflectors, as stigmators and for a fine adjustment of the focal distance. The example in FIG. 2 illustrates the focusing power of the lens element 80 at the example of the beamlet 77.1, and the deflection of a beamlet 77.3 with the electrodes 81.1, 81.2. Beamlet 77.3 is for example deflected in a multi-beam generating unit 27 to minimize deviations from predefined positions in the raster configuration or is deflected in multi-beam deflector unit 41 to achieve telecentric imaging conditions.

In an example, the multi-beam generating unit 71 comprises a planar element 84, such as an electrostatic element in proximity downstream of a micro optical raster element 73.3 in direction of the electron beam 70. Planar element 84 is configured with at least one electrode 82 and employed for global focusing or deflection of an entire set of beamlets. The electrostatic element comprising a set of electrodes 82 arranged around an opening is configured to influence the plurality of charged particle beamlets as a whole. In an example, a single electrode 82 is provided, forming a ring electrode. During use, a homogeneous electrostatic field between the global ring electrode 82 and the proximal multi-aperture plate 73.3 is formed, as well as small electrostatic fields inside the apertures of multi-aperture plate 73.3, which focus in an equal way each beamlet of the plurality of beamlets.

The multi-beam charged particle microscope (MCPM) of FIG. 1 further comprises an operation unit 43, which comprises supply hardware and control units to supply voltages and currents to the optical components of the charged particle microscope and controls operation of the MCPM according user instructions and control software. Operation unit 43 is connected to an image processing unit 49 to process image data from the detector 13. Operation unit 43 is further connected to a stage control unit 51 which controls position or movement of the stage with actuators, for example a five-axis stage, which holds the sample 9. Operation unit 43 is further connected to a user interface and other devices, such as a storage or a network (not shown). Operation unit 43 is connected to a multi-beam raster control unit 45 which controls at least one of the multi-beam raster units like the multi-beam generating unit 27 or multi-beam deflector unit 41. Each of the multi-beam raster units further comprises a local control unit 47.1 and 47.2. During use, multi-beam raster control unit 45 and local control units 47.1 and 47.2 provide voltages and currents to the plurality of electrodes of the multi-beam raster units, for individual control of the plurality of electrostatic elements such as the plurality of electrostatic lenses, deflectors or stigmators.

Each electrostatic element is formed during use between electrodes in at least two different planar substrates of the micro-optical element, for example the plurality of electrostatic lenses 80 is formed between the first and the second multi-aperture plates 73.1 and 73.2, the plurality of deflectors or correctors is formed during use between multi aperture plates 73.2 and 73.3, and a global electrostatic lens is formed between multi-aperture plate 73.3 and planar element 84. Each of the multi-aperture plates 73.1 to 73.3 or the planar element 84 are realized as planar substrates or wafers. For each of the electrostatic elements, therefore an adjustment of two planar substrates or wafers with high precision is used. Spacers 83.1, 83.2 and 83.3 are arranged between the elements of the multi-beam generating unit 71 to maintain a constant and predefined distance between the elements as well as to isolate the elements from each other. The lateral alignment with high precision according to embodiments of the disclosure is described below in more detail.

Throughout the disclosure, it is understood that in the illumination beam path with the multi-beam generating unit or multi-beam deflecting unit 71, the beam of charged particles 70, and the plurality of beamlets 77 propagate in positive z-direction with the z-direction pointing downwards and the sequence of planar substrates or wafers, such as multi-aperture plates 73.1, 73.2, 73.3 are arranged in sequence in the direction of the transmitting charged particle beam or beamlets in positive z-direction. With beam entrance side or upper side 74, is understood the first surface or side of an element in the direction of the transmitting charged particle beam or beamlets, with bottom side or beam exiting side 107 is understood the last surface or side of an element in the direction of the transmitting charged particle beam or beamlets. The disclosure shall nevertheless not be limited to only charged particle beams in positive z-direction with the z-direction pointing downwards.

Figure 3:
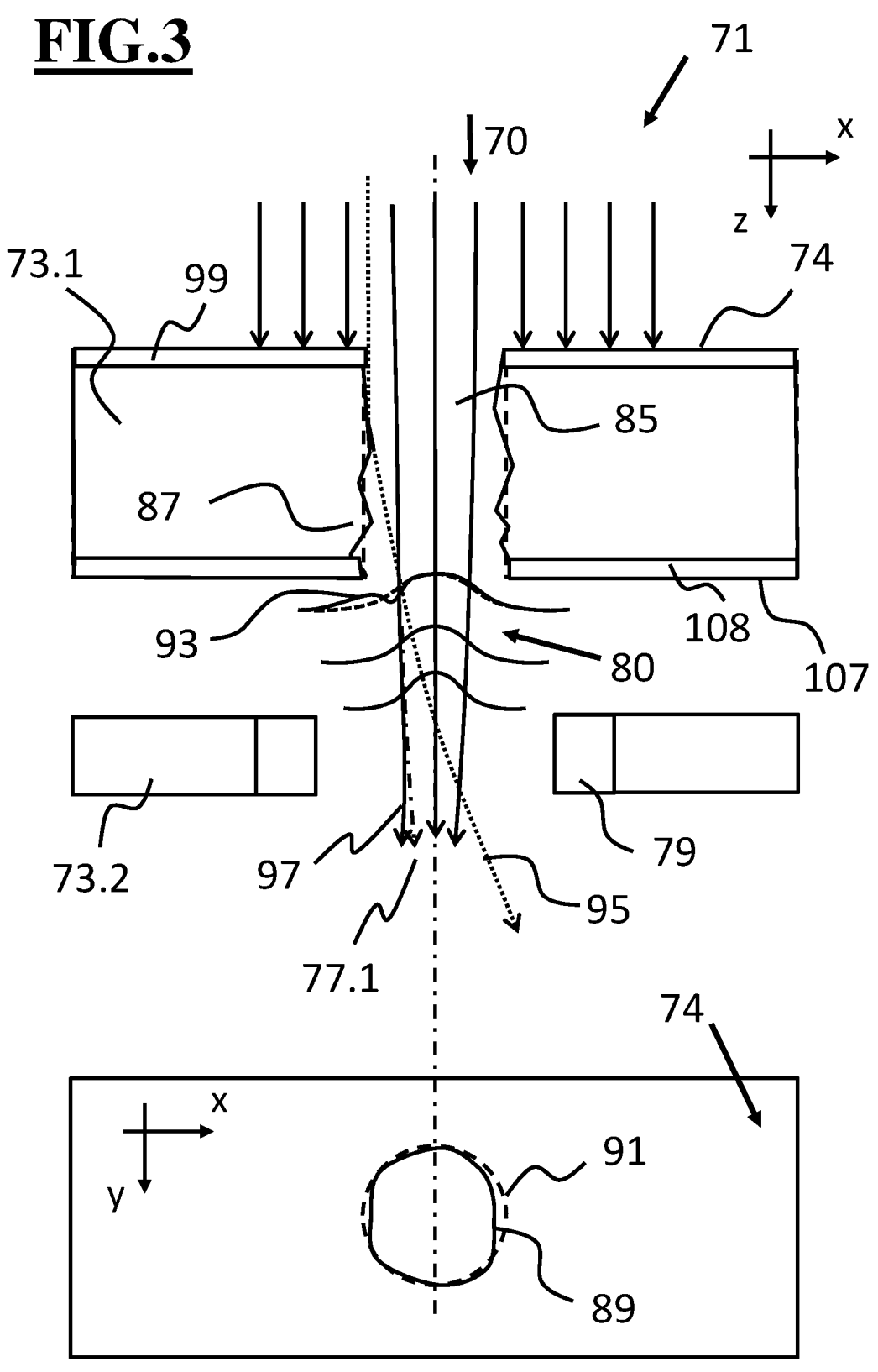
FIG. 3 shows an electrostatic element formed during use between two multi-aperture plates.

Each electrostatic element is configured by a set of one or more electrodes, arranged symmetrical around a plurality of apertures of for example two multi-aperture plates 73.1 and 73.2, configured to form an electrostatic element, such as an electrostatic lens, a beam deflector or a beam stigmator for each of the plurality of electron beamlets 77. During use, different voltages are applied to each of the electrodes, and electric fields are generated in the apertures as well as between several multi-aperture plates. In an example, an electrostatic element 80 is arranged in proximity to at least one aperture 85 of a multi aperture plate 73.1, configured to build for example an electrostatic lens during use of the electron microscope. During operation, specific voltages are applied to the various electrodes 79, 81.1, 81.2 of the electrostatic elements and predefined electrostatic fields are generated. An example is illustrated in FIG. 3 in more detail. The multi aperture plate 73.1 is formed by a conductive element with through-holes or apertures such as aperture 85. For simplicity, FIG. 3 shows just one of the plurality of apertures. The function of the first multi aperture plate 73.1 is to split an incident beam 70 into multiple beamlets including beamlet 77.1, which propagate further in the electron-optical projection system. During use, the electrons of the incident beam 70 either pass the apertures such as aperture 85 of the first multi aperture plate 73.1 or are absorbed by a conductive element of the first multi aperture plate 73.1. The first multi aperture plate 73.1 is therefore configured with a stopping power for the high-energy particles at the entry side of the incident electron beam 70. In order to avoid charging and generation of repelling voltage potential, the first multi aperture plate 73.1 is covered by an absorbing and conductive layer 99, which is connected to a large capacity such as for example to ground to empty or dump the absorbed charges. At aperture 85, electron beam 70 passes the aperture 85 of multi-aperture plate 73.1 and electron beamlet 77.1 is generated. Beamlet 77.1 passes the predefined electrostatic lens element 80 and is focused in focus surface 29 (see FIG. 1).

In the example, the first multi aperture plate 73.1 acts as an opposite electrode with at least a second planar substrate 73.2 and thus forms electrostatic lenses 80 between the first multi aperture plate 73.1 and the second planar substrate 73.2. This is achieved by for example configuring the bottom or beam exit side 107 of the first multi-aperture plate 73.1 with a layer of a conductive material 108. The electrostatic lens element 80 is generated by application of a drive voltage difference to electrode 79 and conductive layer 108, and the electrostatic field 80 extends in free space between the electrode 79, and additional conducting or isolating elements in proximity to the electrode such as the conductive layer 108 with the aperture 85. Equipotential lines of the electrostatic field of the electrostatic lens 80 are illustrated in FIG. 3. In detail, the electrostatic field also penetrates the aperture 85 of the multi-aperture plate 73.1.

The optical aberrations of micro-optical elements such as electrostatic lens element 80 are known to be highly sensitive to manufacturing inaccuracies of the apertures. A deviation of an aperture cross section from a predefined shape is illustrated in lower half of FIG. 3, showing the upper or top surface 74 of multi-aperture plate 73.1. The upper or beam entrance surface 74 is generally the first surface of a multi aperture plate in direction of a charged particle beam. The outer contour 89 of aperture 85 deviates from the ideal circular shape shown by dashed circle 91. Deviations in the shape of the electrodes, the shape of additional conducting or isolating elements, especially the apertures such as aperture 85 of multi-aperture plate 73.1, generate, during use, deviations 93 of the electrostatic field 80 from the predefined electrostatic field and thus generate aberrations such that the electron beamlets such as beamlet 77.1 deteriorates from its predefined properties. For example, slowly varying deviations from a predefined or ideal outer contour 89 of an aperture 85 cause for example tilt or astigmatism, as illustrated by electron beam trajectory 97, which deviates from the ideal trajectory of beamlet 77.1 illustrated as dashed line. High frequent deviations such as roughness, defined as standard deviation of the minimal distance between a contour and an ideal shape, cause higher order aberrations or are responsible for the generation of scattered particles. Typical deviations by etch processes are in the order up to 0.5 $\mu$m rms. Generally, the aberrations increase with the power of the electrostatic element or the voltages applied to the electrodes. Scattered particles are for example generated at the upper edges or the apertures 85 at the entrance side of the electron beam 70. In prior art, the shape of the upper edges and inner walls deteriorate from the design shape by statistical process variations and residual inhomogeneity of the deep etching, and thus exhibits significant roughness, inhomogeneities and deviations from the design shape. The diameter of the lower contour, which forms the exit surface diameter of the apertures of the first multi aperture plate may vary from aperture to aperture and from wafer to wafer. The roughness is increased by the inhomogeneity of the isotropic etch step. These deviations cause deviations in the electrostatic field in proximity to the apertures, and therefore cause aberrations in the beamlets and image blurring. In addition, for example slope angles of the inner wall 87 can cause increased scattering of the electrons passing the cylindrical apertures such as aperture 85, as illustrated by scattered electron trajectory 95. The first multi aperture plate 73.1 of a multi-beam generating unit 27 is a main cause of scattered particles, but also other micro-optical raster elements might be subject to deviations from predefined shapes by fabrication inaccuracies which reduce image quality such a as resolution or contrast of the image generated by the multi beam electron microscope 1. To achieve high resolution, high contrast and large throughput, it is a task of the disclosure to minimize aberrations and scattered charged particles.

In a first embodiment of the disclosure, a multi-beam raster unit is configured such that the edges of electrodes and inner sidewalls of apertures are situated with a larger distance to the transmitting beamlets of charged particles, and therefore the impact of deviations of edges of electrodes and inner sidewalls of apertures on the beam properties is minimized.

Figure 4:
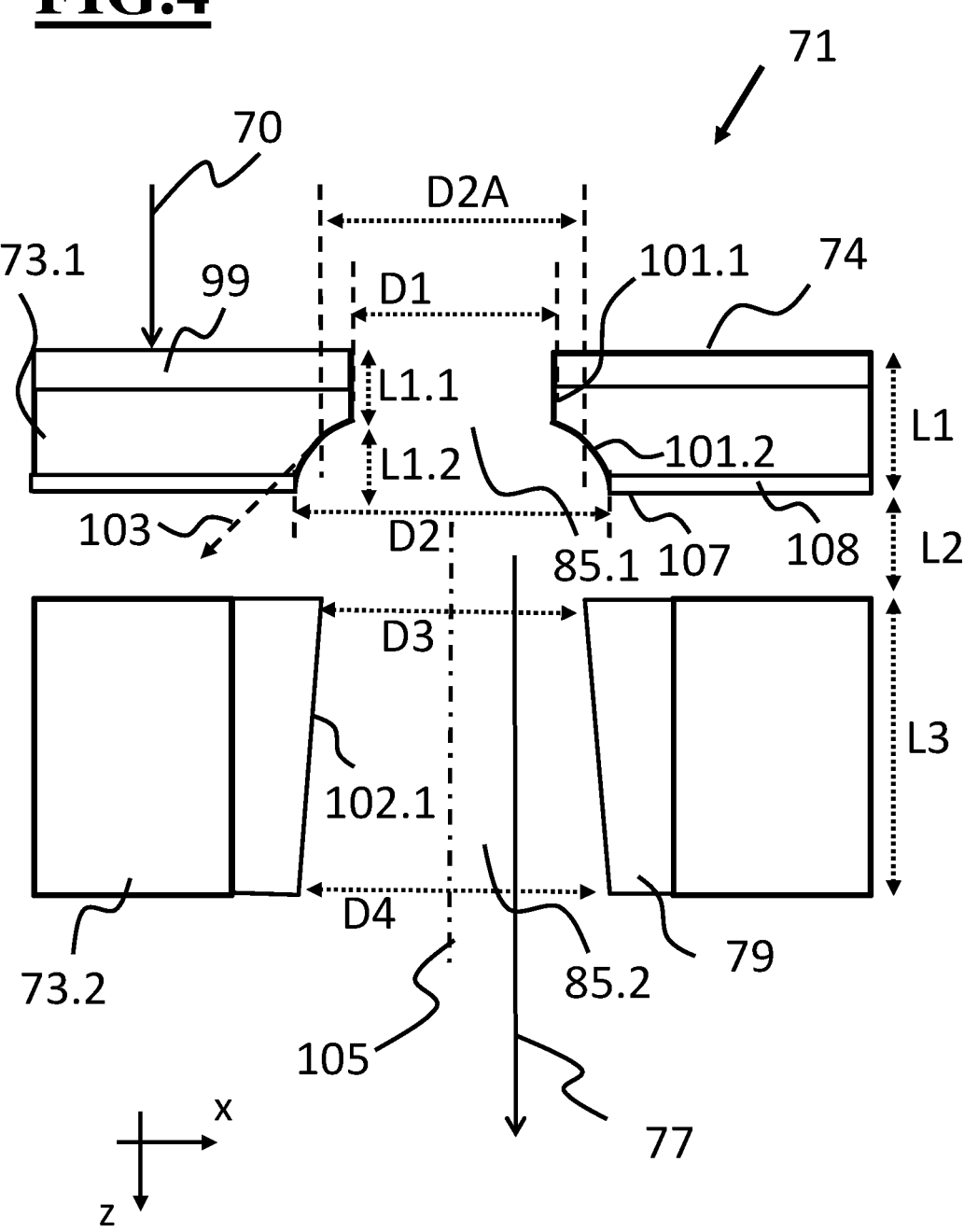
FIG. 4 shows a multi-beam raster unit according an embodiment with a multi-aperture plate with apertures with curved inner sidewalls.

An embodiment of the disclosure is illustrated in FIG. 4. In this embodiment, an inner wall of at least a segment of an aperture opening 85 is configured to be curved and sloping away from the passing charged particle beam, such that an exit diameter, forming an electrode, is larger than an entrance diameter of the aperture. With "sloping away" is generally understood that an inner wall of a segment is configured in a way that the tangent to a point of the inner wall in direction of the z-axis is pointing away from a passing charged particle beam. As a result, the diameter of a segment of an aperture opening continuously increases with increasing z-coordinate. In the example, the lower or second segment has an increasing diameter in direction of the transmitting electron beam and forms in the intersection plane (x-z-plane in FIG. 4) for example a concave circular section. In FIG. 4, an example of one aperture 85.1 in the multi aperture plate 73.1 is shown. Generally, the multi aperture plate comprises a plurality of such apertures 85 in a raster configuration, with only one shown in FIG. 4. The inner walls of aperture 85.1 are configured to be rotationally symmetrically around symmetry axis 105 of aperture 85.1, with the symmetry axis 105 parallel to the incident electron beam 70. The multi-aperture plate comprises an absorbing layer 99 at the entrance side 74. The absorbing layer is connected to ground level.

During use, a large part of the incident electrons from electron beam 70 is absorbed in absorbing layer 99 and an electrical current corresponding to the number of absorbed electrons is generated. For example, with D1=30 μm and the pitch is 150 μm, about 97% of the incident electrons from the incident electron beam 70 are absorbed and a high current of electrons is generated. Absorbing layer 99 shows therefore during use a fluctuating voltage difference corresponding to the induced current and is therefore not suited to form an electrode for an electrostatic element 80.

The multi-aperture-plate 73.1 with aperture 85 comprises a first segment 101.1 and a second segment 101.2 with z-extensions L1.1 und L1.2. The incident electron beam 70 is impinging in parallel to the z-direction and is either absorbed and guided away in the absorbing layer 99 or passes the aperture 85.1. At the entrance surface 74, the aperture 85.1 has a diameter of D1. The second segment 101.2 is configured with inner sidewalls forming concave circular sections in the x-z-plane, with continuously increasing diameter and tangent vectors 103 in x-z-plane are pointing away from the main direction of the passing electron beam 77. The slope at the inner walls of the second segment 101.2 is thus pointing away from the passing electron beam 77 and ends with a maximum aperture diameter D2 at the exit or bottom surface 107 of the multi-aperture plate 73.1. The maximum aperture diameter D2 at the exit surface 107 is larger as an average aperture diameter D2A within the second segment 101.2, which is larger compared to the aperture diameter D1 of the first segment 101.1. The beam exit surface 107 is covered by a conductive layer 108, which is connected to a potential, for example to ground level. The conductive layer with boundary or edge with diameter D2 forms an opposite electrode for an in z-direction subsequent, second multi-aperture plate 73.2, which is adjacent to the first multi aperture plate 73.1. To form, during use, an electrostatic element, the second multi-aperture plate 73.2 is configured with ring-electrodes 79 around apertures 85.2 with diameter D3 to form during use electrostatic lenses 80 (see also FIG. 3) between the conductive layer 108 and the ring-electrodes 79. At least in a segment 102.1 the inner walls of the apertures 85.2 of the second multi-aperture plate 73.2 can be configured to be curved or sloping away from the passing electron beam 77 as well. In another example, the inner walls 102.1 of the electrodes can be configured parallel to the z-axis. In the example of FIG. 4, the second multi-aperture plate 73.2 embodiment comprises a segment 102.1 with electrode 79, in another example the second multi-aperture plate 73.2 comprises further segments 102.2 (see below). The second multi-aperture plate comprising electrodes 79 has a length L3 about 30 μm-300 μm. A design and an example of a fabrication method of the second multi-aperture plate 73.2 is described in US20190259575, which is hereby incorporated by reference.

According to the example of FIG. 4, while only one aperture 85.1, 85.2 is shown, a plurality of electrostatic elements in a raster configuration between pairs of apertures such as aperture 85.1 and 85.2 is configured by a plurality of electrodes such as ring-electrodes 79 at the entrance side of a second multi-aperture plate 73.2 and a plurality of electrodes provided at the exit side of the first multi-aperture plate 73.1, for example the conductive layer 108. The plurality of electrostatic elements with ring electrodes 79 form, during use, a plurality of electrostatic lenses in the raster configuration, including lens 80. In another embodiment, a plurality of electrostatic elements is configured with multiple electrodes 81 in a raster configuration to form, during use, together with for example conductive layer 108 a plurality of deflectors or correctors in the raster configuration. At least a second or lower segment of the first multi-aperture plate 73.1, which forms the opposite electrode to the electrodes of second multi-aperture plate 73.2, comprises inner walls configured to be curved or sloping away from the passing electron beam 77 and form an aperture diameter at the beam exit side D2 larger than D1. Fabrication tolerances of the aperture opening in the exit surface 107 create optical aberrations of the electrostatic element. By increasing the second diameter D2 by more than 10% relative to the first diameter D1, a reduction of optical aberrations by a factor of 5-10 is achieved. The first, beam entrance segment 101.1 of the first multi-aperture plate 73.1 is configured as a conductive membrane with apertures (openings), the membrane regions between the apertures act as aperture stops for the incident electron beam 70 and defines the set of beamlets 77.

In the beam entrance segment 101.1, the apertures are cylindrical with a lateral diameter of D1 and have a small extension in z-direction of L1.1, wherein 2 μm≤L1.1≤5 μm. The thickness of the first segment with parallel sidewalls is thus significantly reduced compared to the thickness L1 of the first multi-aperture plate 73.1. The thickness of the beam entrance segment is determined as a trade-off between its ability to stop the incident charged particles between the apertures and the controlling of the scattering along its sidewalls. A reduction of the thickness of the parallel sidewalls of a multi-aperture plate by a factor of two reduces the scattering by 50%. In this example, the second segment 101.2 with curved sidewall reduces the thickness of the cylindrical aperture to L1.1=L1/2 and thereby reduces the scattering of the first multi-aperture plate 73.1 to 50%. An even further reduction of L1.1 to L/3 reduces the scattering of the first multi-aperture plate 73.1 to approximately 30%.

The distance P1 from aperture center to aperture center is typically in the range of 30 μm≤P1≤250 μm. The surface ratio of the surfaces of the aperture openings to the total surface of an aperture plate is defining the transmission of an aperture plate. The transmission tr is typically 5%≤tr≤20%, such as 10%≤tr≤15%.

In one example, following parameters are selected: D1=30 μm, D2=40 μm, D3=55 μm, D4=55-75 μm, L1.1=5 μm, L1.2=5 μm, L1=10 μm, L2=20 μm, and L3 is >400 μm.

In another example, following parameters are selected: D1=18 μm, D2=25 μm, D3=20 μm, L1.1=5 μm, L1.2=10 μm, L1=15 μm, L2=20 μm, and L3>40 μm. In some embodiments, L1.2≤10 μm.

In another example, the following relations hold: in a range between first thickness L1.1≤D2≤4*L1.1, such as L1.1≤D2≤3*L1.1, for example L1.1≤D2≤2*L1.1.

Generally, the entrance side aperture diameter D1 in the absorber layer 99 is in the range of 10 μm≤D1≤50 μm, the lateral exit surface diameter D2 of the apertures in the electrode layer 108 is larger than D1, i.e. D2>D1, and D2 can be configured in a range of 15 μm≤D2≤60 μm. The thickness of the first multi-aperture plate 73.1 is such as 3 μm≤L1≤15 μm. It is generally advantageous to have a thin first multi aperture plate 73.1 with L1<D2, or even L1<D2/2, or even better with L1<D1, or even better L1<D1/2. In an example, L1 is larger or equal to D2/4. It is further advantageous to have D2 in a range between L1 and 5 times L1, or L1<D2<5*L1, such as L1<D2<4*L1, for example L1<D2<2*L1. In each configuration, the thickness L1 can be thin enough to avoid unnecessary scattering of the transmitting charged particles and in parallel, it is thick enough to achieve sufficient absorption of the incident beam of charged particles between the apertures. The entrance diameter D3 and the exit diameter D4 of the second multi aperture plate 73.2 can be between 15 μm and 75 μm. The distance L2 between first and second multi-aperture plates 73.1 and 73.2 can be relatively small, for example 10 μm≤L2≤30 μm. Electrostatic cross talk between the plurality of electrostatic elements is avoided by an axial distance (in z-direction) L2 smaller than the aperture diameters D2 or D3. D2 can be larger than L2, but smaller than 3 times L2, such as smaller than 2 times L2. The first segment 102.1 of the second aperture plate 73.2 can have a thickness L3 similar to the diameter D3 or D4. In an example, the entrance diameter D3 of an aperture of the second multi aperture plate 73.2 with electrodes 79 is between D1 and D2, thus D1<D3<D2, but in another example, D3 can also be larger compared to D2, D3>D2. In general, D1 has the minimum diameter, such that D1<D2, D1<D3, D1<D4. By such a design and fabrication with D2 larger than D1 as well as L1, such as with 2*L2>D2>L2, for example with D3>D2, the influence of any deviations of the edge contour of the electrodes in elements 73.1 and 73.2, which are responsible for the performance and properties of the electrostatic elements, are reduced.

As well be explained in more detail below, the first multi-aperture plate can comprise a third segment 101.3. By configuring an inner wall of at least a second or third segment 101.2, 101.3 of an aperture opening to be curved and sloping away from the passing charged particle beam 77, and by shaping the second or third or fourth diameters D2 to D4 of the apertures of the multi aperture plates larger than the diameter D1 of a first, thin segment of the apertures, the scattering of passing charged particles 77 is reduced. By configuring an inner wall of the lower segment 101.2 of the multi aperture plate 73.1 to be sloping away from the passing charged particle beam 77, such that the second segment ends with a larger aperture diameter D2 at the exit surface 107 or multi aperture plate 73.1, the negative influences of deviations and fabrication tolerances during fabrication of the aperture plate on the electrostatic field of the electrostatic lens 80 are reduced and aberrations of the passing charged particle beam 77, as illustrated at FIG. 3, are reduced. A high shape precision and position accuracy of electrodes can be achieved, such as electrodes 79 in the multi aperture plate 73.2, and the opposite electrode at the lower boundary or edge of the aperture 85 with increased diameter D2>D1 in the exit surface 107 of the multi aperture plate 73.1 covered by conductive layer 108. In an example, the conductive layer 108 covers also the sidewalls of the apertures of at least the second segments 101.2 of multi-aperture plate 73.1. Thus, any secondary or scattered electrons, hitting the sidewalls, is conducted away and does not disturb the electrostatic elements formed below. A precise distance L2 is achieved for example by spacers and, during use, the plurality of electrostatic elements of the multi-beam generating unit or multi-beam deflector unit are formed with high precision. Each of the first, beam entrance segment 101.1 and the second, beam exit segment 101.2 are formed in one substrate or piece by double-sided processing, described in more detail below.

The first segment 101.1 of FIG. 4 comprises parallel inner sidewalls, like conventional apertures. In another embodiment it is also possible to configure the first segment 101.1 with inner walls to be sloping away from the passing charged particle beam 77. In such a case, the transmission of the electron beam forms a transition zone in which the transmission is gradually decreasing with increasing distance to the aperture center 105.

FIG. 4 only shows a part of an inner zones or membranes of the multi-aperture plates 73.1 and 73.2. As will be explained in more detail below, a multi-aperture plate further comprises a support zone to support the thin membrane zone and to provide mechanical stability.

In a second embodiment of the disclosure, a multi-beam raster unit 71 is configured by at least two separated segments. The influence of deviations to the optical performance is reduced by functional separation between the upper edge of the multi aperture plate, which acts as beam stop and forms the beam, and the lower edge of the multi aperture plate, which forms the electrostatic lens with the subsequent second micro-optical raster element. In an example, a first multiple aperture plate comprises two or more separate planar separate segments or substrates, each prepared separately by single-sided or double-sided structuring. The segments are assembled to form a composite multi aperture plate. Thus, a more precise definition of the size and position and low roughness of both edges is provided by separate processing of the at least two segments. In addition, the edges of electrodes and inner sidewalls of apertures are situated with a larger distance to the transmitting beamlets of charged particles, and therefore the impact of deviations of edges of electrodes and inner sidewalls of apertures on the beam properties is further minimized.

Figure 5:
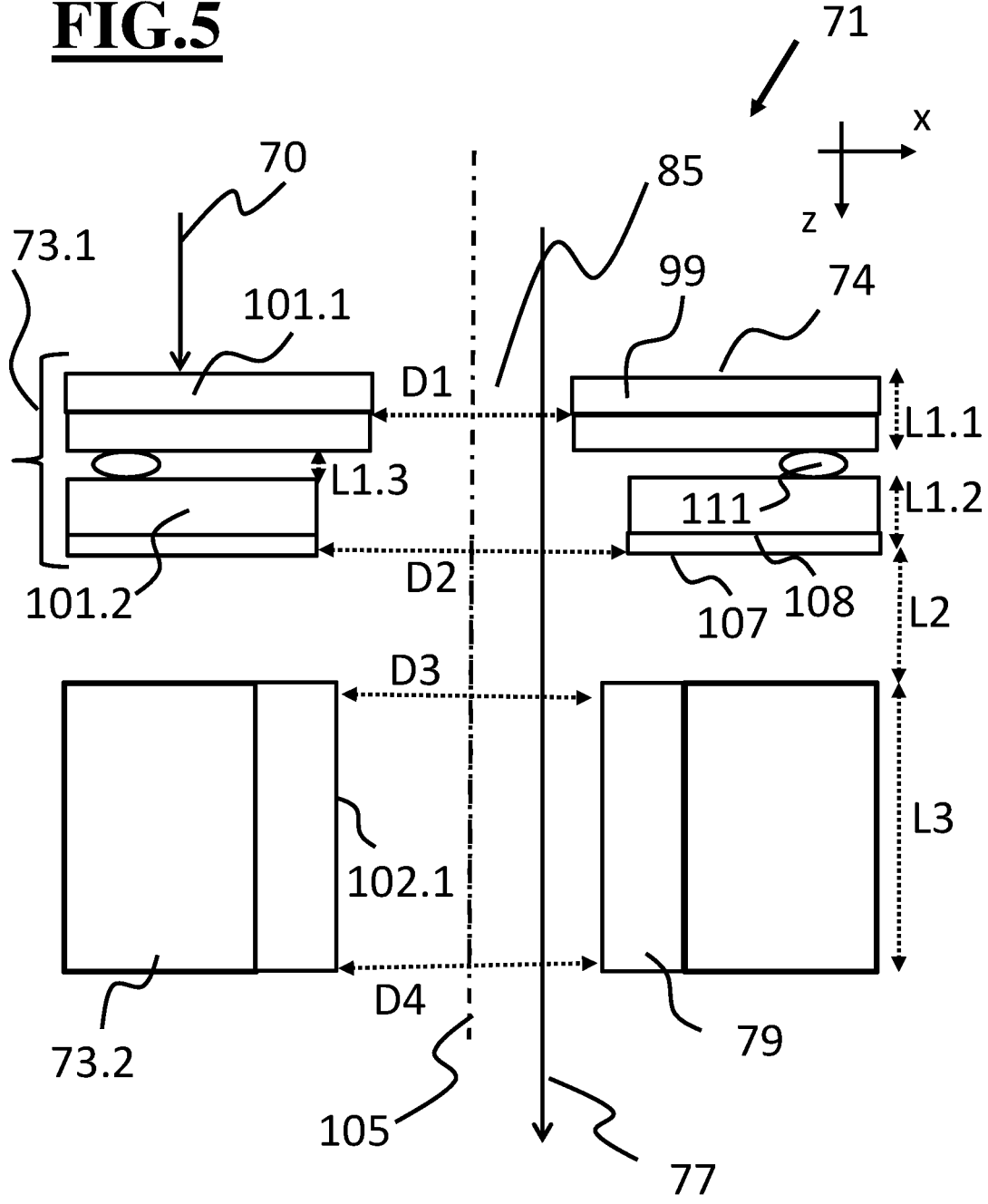
FIG. 5 shows a multi-beam raster unit according an embodiment with a multi-aperture plate comprising two separate segments.

A multi aperture plate separated into at least two parts serving different functions is illustrated in FIG. 5. The two segments 101.1 and 101.2 are formed as separate segments and are adjusted and joined together with known techniques. Thereby, a functional separation between the first, beam entrance segment 101.1 which forms the passing charged particle beam 77, and the lower, second beam exit segment 101.2, which forms the electrostatic lens with an adjacent multi aperture plate 73.2 with electrodes 79, is achieved. The first segment 101.1 is covered by a conductive metal membrane 99 with the capability to absorb and conduct away most of the impinging charged particles 70. The second segment is formed as a silicon or SOI-membrane with a conductive metal layer 108, forming the opposite electrode to subsequent electrodes following in z direction. Both membranes are aligned and fixed together e.g. by a glue or by bonding or welding, with fixation points 111, such as glue or welding points. It can be desirable to keep a distance L1.3 between the two separate segments 101.1 and 101.2 as small as possible, for example below the thickness L1.2 of the second segment 101.2 or below the thickness L1.1 of the first segment 101.2. As with the example described in connection with FIG. 4, It is advantageous to configure D2 larger as the total thickness L1, formed by the sum of L1.1 plus L1.2 plus L1.3, but not larger as 5 times L1, such as 3 times L1, for example 2 times L1. In addition, the diameter D2 of second segment 101.2 is larger than D1. Generally, for dimensions the same limitations as given above can be desirable. In another embodiment, the inner wall of the second segment 101.2 can also be shaped to be sloping away from the passing charged particle beamlet 77. The thin second segment 101.2 is precisely structured and aligned with the adjacent aperture plate 73.2 with electrodes 79 and thus defines, during use, precise and aberration-free electrostatic lenses. With a first multi-aperture plate 73.1 comprising at least two separated segments 101.1 and 101.2, each segment can be formed by single-sided processing. Each of the segments 101.1 and 101.2 can be structured by known planar processing techniques of planar substrates, such as a metal membrane, Silicon or a SOI wafer and can be precisely aligned together with second multi-aperture plate 73.2 along the plurality of symmetry axis 105 (one shown in FIG. 5) of the plurality of apertures 85 (one shown in FIG. 5).

In another example, the two segments 101.1 and 101.2 are attached to each other with a special holder which allow fine passive or active alignment. For an active alignment, the holder comprises guiding elements and actuators such as piezo actuators.

The upper aperture diameter D1 at entrance surface 74 can be in the range of 10 µm≤D1≤50 µm, the exit aperture diameter D2 is larger, for example can be 15 µm≤D2≤60 µm. The smaller distance L2 is such as in a range of 10 µm≤L2≤30 µm and can be controlled very precisely with the desired sub µm accuracy. With the configuration of two separated segments 101.1 and 101.2, the first segment 101.1 is structured from the top or entrance side 74 and a high precision of the entrance aperture diameter D1 is achieved and the second segment 101.2 is structured from the bottom side 107, and thus a high precision of the aperture diameter D2 at the bottom side 107 of the second segment 101.2 is achieved. By configuring the multi aperture plate 73.1 comprising at least a first separate and a second separate segment 101.1, 101.2 such that the second segment 101.2 ends with a larger aperture diameter D2 as D1 at the exit surface 107 or multi aperture plate 73.1, the negative influences of deviations and fabrication tolerances during fabrication of the aperture plate on the electrostatic field of the electrostatic lens 80 are reduced and aberrations of the passing charged particle beam 77, as illustrated in FIG. 3, are reduced. Therefore, the shape of the passing charged particle beam 77 is very well controlled as well as the electrostatic element formed between the lower or bottom side 107 with conductive film 108 and the electrodes 79 is well defined. By such a design and fabrication, a high shape precision and position accuracy of electrodes 79, the lower boundary or edge of the aperture 85 with increased diameter D2>D1 in the exit surface 107 of the second segment 101.2 of the multi aperture plate 73.1, and distance L2 is achieved and, during use, the plurality of electrostatic elements of the a multi-beam generating unit or multi-beam deflector unit are formed with high precision. Position accuracy of the electrodes 79 and the lower boundary or edge of the aperture 85 in the exit surface 107 are well defined with a precision better than 0.5 µm.

Figure 6:
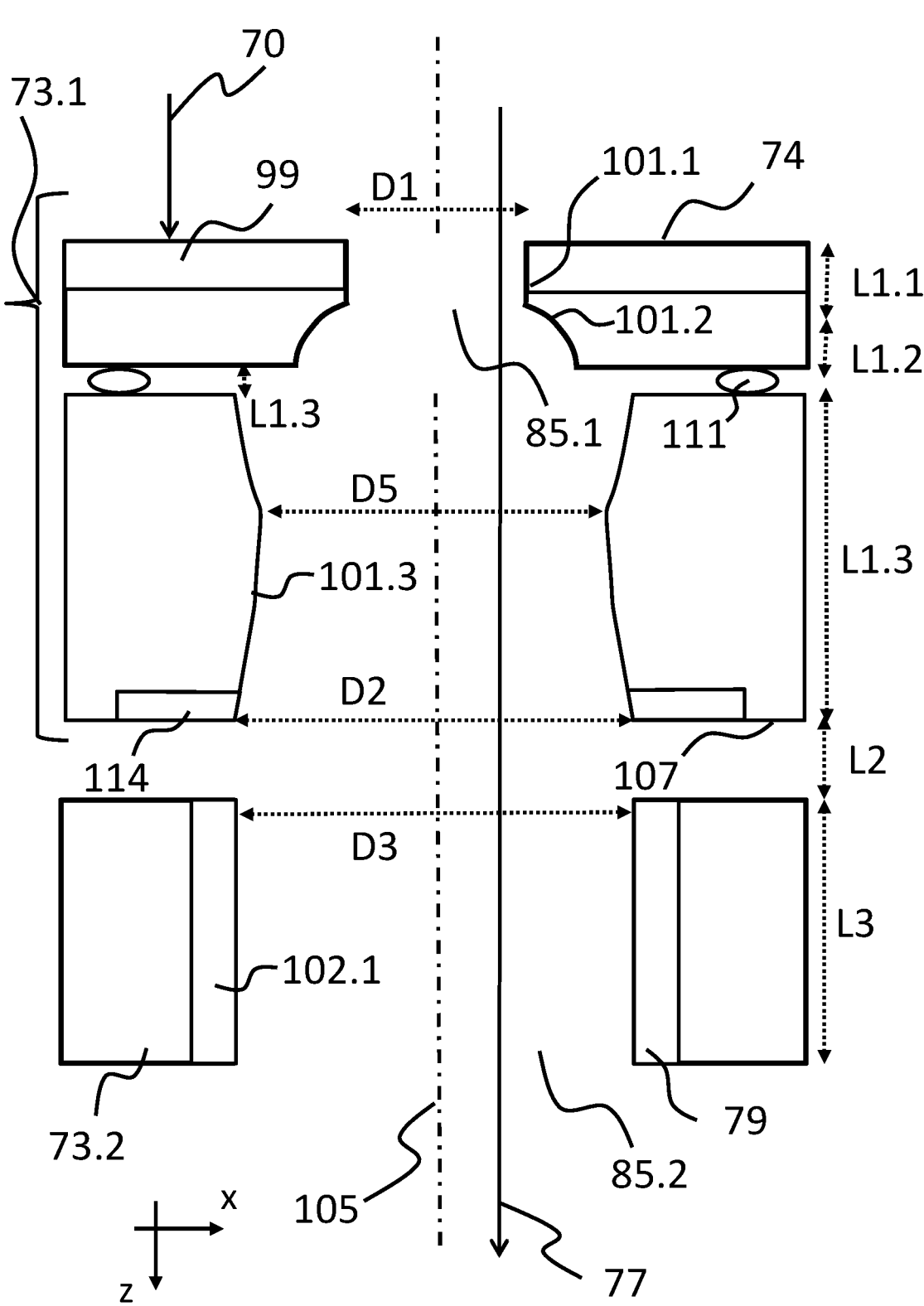
FIG. 6 shows a multi-beam raster unit according an embodiment with a multi-aperture plate comprising two separate segments and apertures with curved inner side-walls.

In a third embodiment, the structural elements to reduce aberrations and scattering, and thereby improve resolution and image contract, are combined. Thereby, aberrations are reduced even more. An example is illustrated in FIG. 6. The first multi-aperture plate 73.1 of this embodiment comprises three segments and comprises two separated parts. An absorbing and conducting surface metal layer 99 forms a part of the first, beam entrance segment 101.1 of the first multi-aperture plate 73.1. The second segment 101.2 is formed as illustrated in the example of FIG. 4, and an inner wall is curved and sloping away from the passing beam of charged particles 77. First and second segment 101.1 and 101.2 have similar properties and dimensions as in the example of FIG. 4 and form for example one part fabricated by double sided processing. The first multi-aperture plate 73.1 further comprises a third, thick beam exit segment 101.3, which is formed as a separate segment for example made off Silicon or SOI with through holes or apertures and attached to the bottom side of the second segment 101.2, for example with attachment points 111. Thereby, a small gap of width L1.3 between 5-15 µm is maintained. In another example, segment 101.3 can be directly attached to segment

101.2, and no gap will be formed. The length of the third segment 101.3 is about 50-300 µm, and the bottom surface of the third segment 101.3 forms the bottom or exiting surface 107 of the multi-aperture plate 73.1. The aperture at exit side 107 has a maximum diameter D2>D1, and in the exit surface 107 an exit diameter. D2 can be in the range of 30 µm≤D2≤70 µm. The exit surface 107 of the third segment 101.3 comprises ring-shaped conductive layers or electrodes 114 around or in proximity to the apertures of diameter D2, which are connected to a constant voltage potential, for example to ground level, and which form the opposite electrodes to an in z-direction subsequent, second multi-aperture plate 73.2. As an alternative, the exit surface 107 of the second segment 101.3 and the inner sidewalls of the plurality of apertures in the third segment 101.3 can also be covered by a conductive layer, like layer 108.

The second multi-aperture plate 73.2 with electrodes 79 is configured with a distance L2 between 15 µm and 30 µm to the first multi-aperture plate 73.1 and forms during use an electrostatic lens with the electrodes of the third segment 101.3. The third segment 101.3 is structured from the bottom side 107, and thus a high precision of the aperture diameter D2 of the third segment 101.3 is achieved. Therefore, the shape of the passing charged particle beam 77 is very well controlled as well as the electrostatic element formed between the electrodes 114 and the electrodes 79 is well defined. By such a design and fabrication, a high shape precision and position accuracy of electrodes 79, the lower boundary or edge with diameter D2 in the exit surface 107 of the third segment 101.3 covered by conductive layer 114, and distance L2 is achieved and, during use, the plurality of electrostatic elements of the multi-beam generating unit or multi-beam deflector unit are formed in a raster configuration with high precision. Throughout the thickness L1.3 of the third segment 101.3, the minimum inner diameter D5 of each aperture through the third segment 101.3 is larger than D1, thus scattering of charged particles can be avoided even if thickness L1.3 is large.

Figure 7:
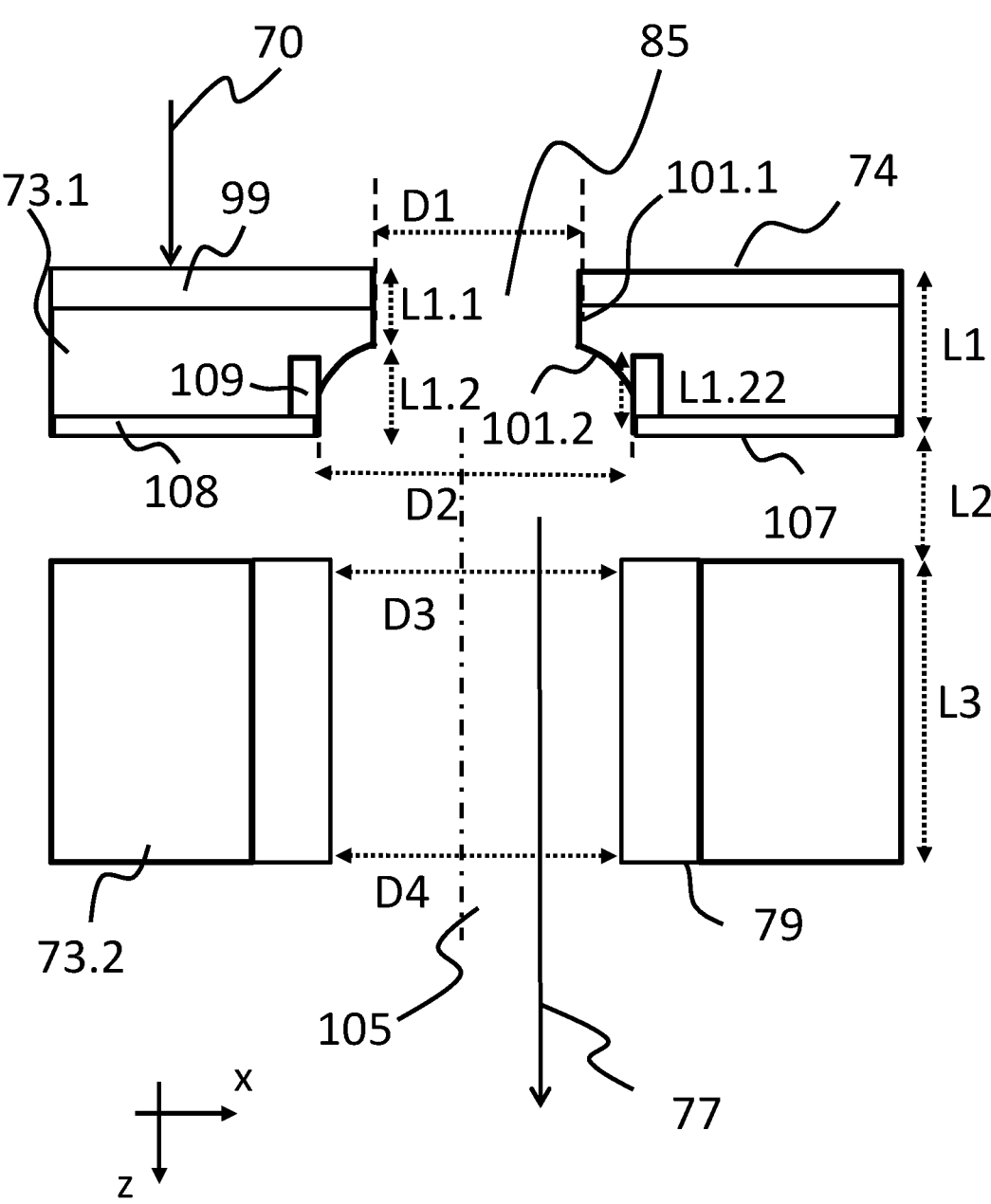
FIG. 7 shows a multi-beam raster unit according an embodiment with etch stop rings.

In a forth embodiment of the disclosure, the multi aperture plate is configured with etch stop rings around the plurality of apertures. With etch stop rings, a high precision of the shape and roughness of the aperture openings in the entrance or exit surface of a multi-aperture plate is achieved. In the example of FIG. 7, an etch stop ring 109 of length L1.22 is formed into the bottom or exit surface 107 of the multi-aperture plate 73.1, covered with conductive layer 108. The etch stop ring 109 is formed by lithography and directed etching with high precision, and with an inner diameter D2 larger than D1. Each etch stop ring is for example etched into the silicon or SOI wafer by directed etching to form a circular trench and refilled with for example $SiO_2$ or other appropriate etch-stop materials. With the precisely formed etch stop ring 109 around the circumference of the aperture opening 85 at the exit surface 107, the aperture openings can be etched for example by isotropic etching limited by the etch stop rings 109. The etch stop rings 109 allow a high precision control of diameters D2 to achieve an accuracy better as 0.5 µm, or 0.25 µm or 0.1 µm or even below, and the roughness can be controlled to be well below 0.1 µm, or even below 0.05 µm. Consequently, the electrostatic lens in conjunction with multi aperture plate 73.2 comprising electrodes 79 is formed, during use, with high precision and very low aberrations.

The disclosure is illustrated in FIGS. 4, 5, 6 and 7 at the example of a second multi aperture plate 73.2 comprising ring electrodes 79 to form an electrostatic lens element 80 between first and second multi-aperture plate. In other examples the second multi-aperture element 73.2 can comprise multiple electrodes 81 to form an electrostatic multistigmator or corrector or deflector element with multiple electrodes 81 arranged around each aperture. The embodiments are explained at the examples of circular apertures, but the disclosure is not limited to circular apertures, but also applicable for example to elliptical apertures or apertures of other shapes, including etch stop rings of corresponding shape and electrodes of corresponding shape.

Figure 8:
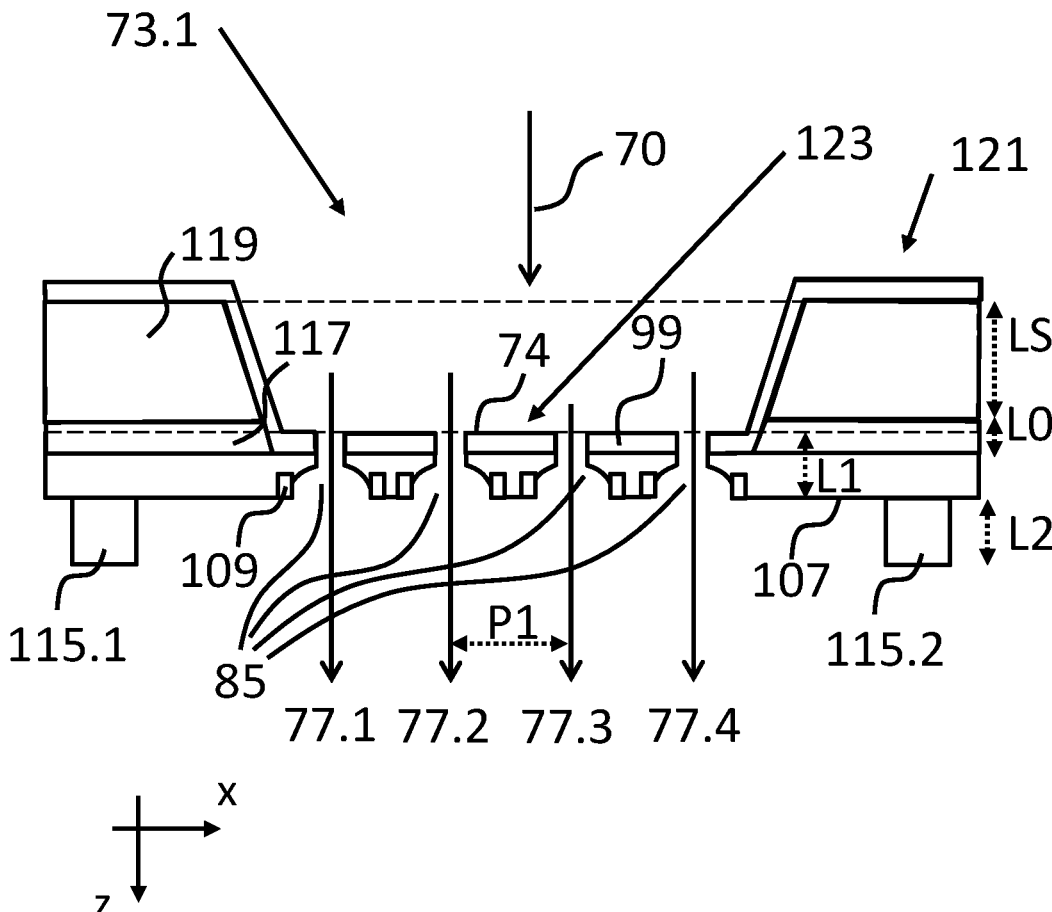
FIG. 8 shows a multi-aperture plate of a multi-beam raster unit according an embodiment.

FIG. 8 illustrates an embodiment of a multi-aperture plate 73.1, 73.2 at the example of the embodiment according FIG. 7. The multi-aperture plate 73.1 comprises an inner or central area or membrane 123 and a support zone 121, arranged at the outer circumference of the multiple aperture plate 73.1. In each of the FIGS. 2-7, only a part of the inner zone, central area or membrane 123 is illustrated for each multi-aperture plate, with for example a thickness of L1 of about 10 μm. At least the membrane 123 is covered by an absorbing and conducting metal layer 99 and comprises a plurality of apertures 85 (only four shown) with distance P1 for the transmitting beamlets of charged particles 77.1, 77.2, 77.3 and 77.4 from the incident charged particle beam 70. The inner or central area has a thickness L1<15 μm. The apertures at exit surface 107 comprise etch stop rings 109 (only one indicated by reference number 109). The support zone 121 comprises additional supporting structures to improve the mechanical stiffness of multi aperture plate 73.2, for example a first layer 117 of thickness L0 and a second layer 119 of thickness LS. First and second layer 117 and 119 can comprise isolating or conducting or semiconducting materials such as Silicon dioxide (SIO2), metals, or Silicon. Adjusting elements 115.1, 115.2 for attachment and adjustment of subsequent multi aperture plates are attached to the bottom surface 107. By processing the top surface 74 and the bottom surface 107 in planar processing operations, a high precision of aperture openings at the top surface 74 as well as the bottom surface 107 is maintained.

According to an embodiment, each multi-aperture plate is formed in an assembly of one, two or more parallel planar substrates, for example created by silicon micro structuring. Other manufacturing techniques are for example additive manufacturing. In Silicon micro structuring, the planar substrates are fabricated on a Silicon or SOI wafer. A central part of the wafer is structured as a membrane with 3-20 μm thickness with apertures or through holes. The wafer with the apertures or through holes comprises two zones. The apertures are realized by an etch process, comprising for example isotropic etch processes such as SF6 plasma-etching, anisotropic vertical etching such as DRIE (gas-chopping or cryogenic) or wet etching. The local etching is controlled by masks formed by standard lithography processes utilizing precise lithographic masks. The wafer is optionally covered a by a conductive layer, for example by gold, to increase both its conductivity and stopping power for fast incident (30 keV) electrons.

The fabrication process of the first multi-aperture plate 73.1 employs a double-sided processing, with first processing at the entrance side 74, and second processing from the back or bottom side 107. Inner sidewalls forming circular sections are for example fabricated by isotropic plasma etching of Silicon or SOI with a SF6 plasma. The processing can also start with the processing of the second segment 101.2 from the bottom or lower side 107 of the multi-aperture plate 73.1, and the beam bundle defining apertures in the first segment 101.1 are fabricated in a second step. The second multi aperture plate 73.2 is attached to the first multi aperture plate 73.1 for example by spacers in the circumference of the aperture plates and an isolating vacuum gap between the two aperture plates 73.1 and 73.2 is formed.

Figure 9:
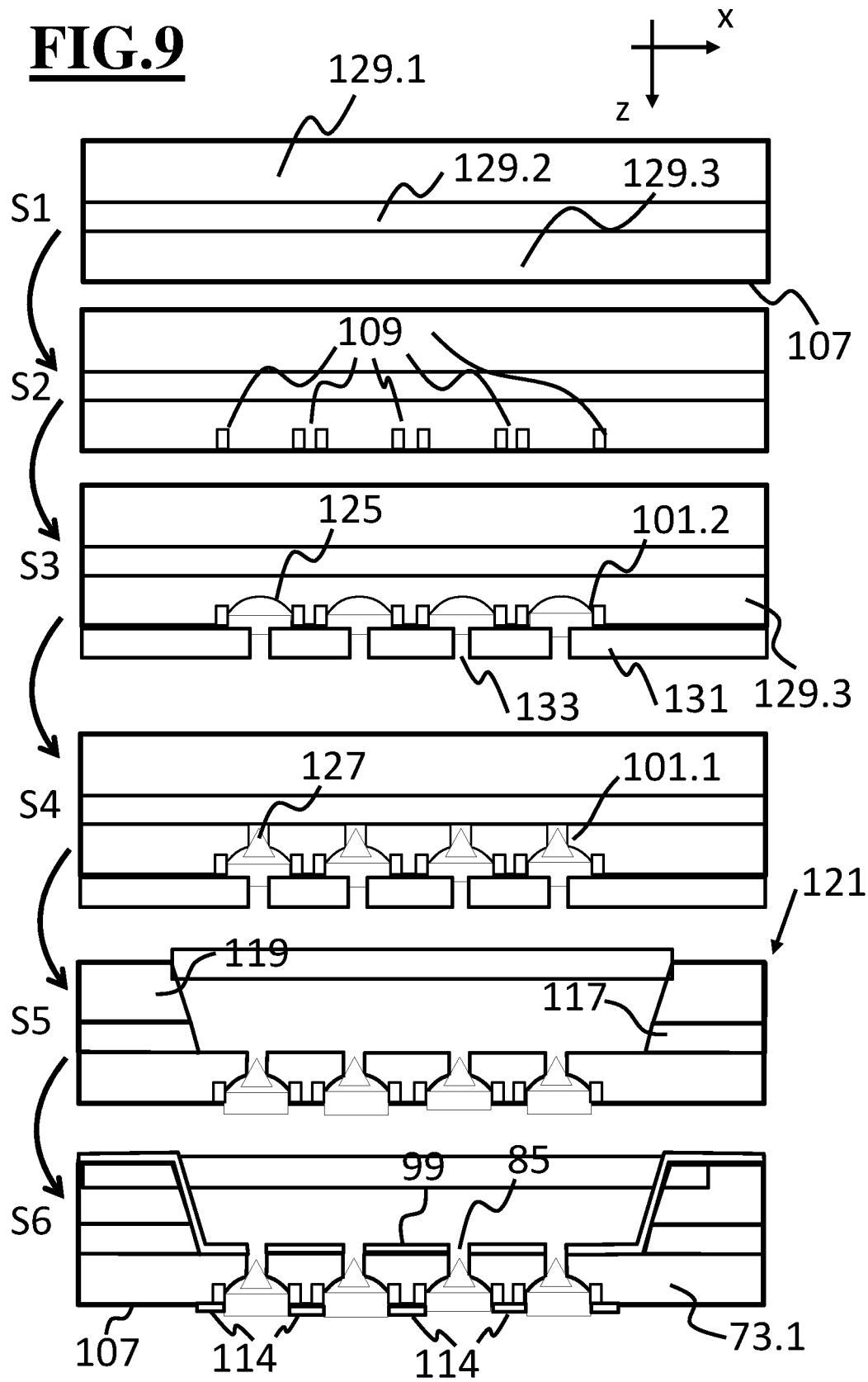
FIG. 9 shows steps of a fabrication method of a multi-aperture plate of a multi-beam raster unit according an embodiment.

FIG. 9 describes a method of fabrication of a multi-aperture plate according to an embodiment in more detail. Reference will be made to multi-aperture plate 73.1, but steps of the fabrication method may as well be applied to other multi-aperture plates 73.2 or 73.3. In step S1 an SOI wafer is provided with three layers, a first, thick top layer 129.1, a second, intermediate layer 129.2 and a third or device layer 129.3. The intermediate layer 129.2 is formed as a buried oxide layer. The third layer 129.3 is polished down to a thickness equal to the membrane thickness of approximately 10 μm. Optionally, the bottom surface 107 is further configured for example by wet etching to comprise alignment or adjustment spacers in the periphery of the wafer. After step S1, in a step S2, circular etch stop rings 109 are formed into the device layer 129.3 from the bottom side 107. First, circular trenches are formed by directional RIE etching through a lithographically formed first etch mask (not shown) on the bottom side 107 with depth ca. 30-75% of the SOI thickness, for example 3 μm to 7.5 μm. The first etch mask (not shown) is removed and the trenches are filled by deposition with $SiO_2$, which form the etch stop material of etch stop ring 109. After step S2, in a step S3, the second segment 101.2 is formed by isotropic Silicon plasma etching. For the plasma etching, a second etch stop mask 131 is formed by photoresist deposition and lithographically structuring. The second etch stop mask 131 comprises a plurality of small, circular openings 133 concentric with the plurality of circular etch stop rings 109. After isotropic Silicon plasma etching, structures 125 with the form of a segment of a sphere are formed in the device layer 129.3. The etched shape is controlled by openings 133, the etching time and the etch stop rings 109. After step S3, in a step S4, through holes 127 are formed in device layer 129.3 by directed, plasma assisted etching, for example DRIE (Deep Reactive Ion Etching) through Silicon. The etch depth is limited by the intermediate layer 129.2, which acts as an etch stop layer. Thereby the first segments 101.1 with cylindrical sidewalls and the second segment 101.2 with curved sidewalls of the multi aperture plate 73.1 are formed. The bottom side 107 can be further protected by a protective coating (not shown). In a step S5 the result of a further etching of the first and second layer 129.1 and 129.2 is shown. The first layer 129.1 and second, intermediate layer 129.2 are etched through by known processes and the supporting structures 117 and 119 of the supporting zone 121 are formed. The second etch stop mask 131 and optional protective coating is removed. After step S5, in a step S6, an electron stopping and conductive layer 99 is formed by deposition of for example gold or other dense metals at least at the entrance of upper side of the multi aperture plate 73.1. A conductive layer 114 is formed at the bottom or lower side 107 to form opposing electrodes for a subsequent multi aperture element. Optionally, the multi-aperture plate 73.1 is completely covered by a conductive layer 99 or 114 from all sides.

Figure 10:
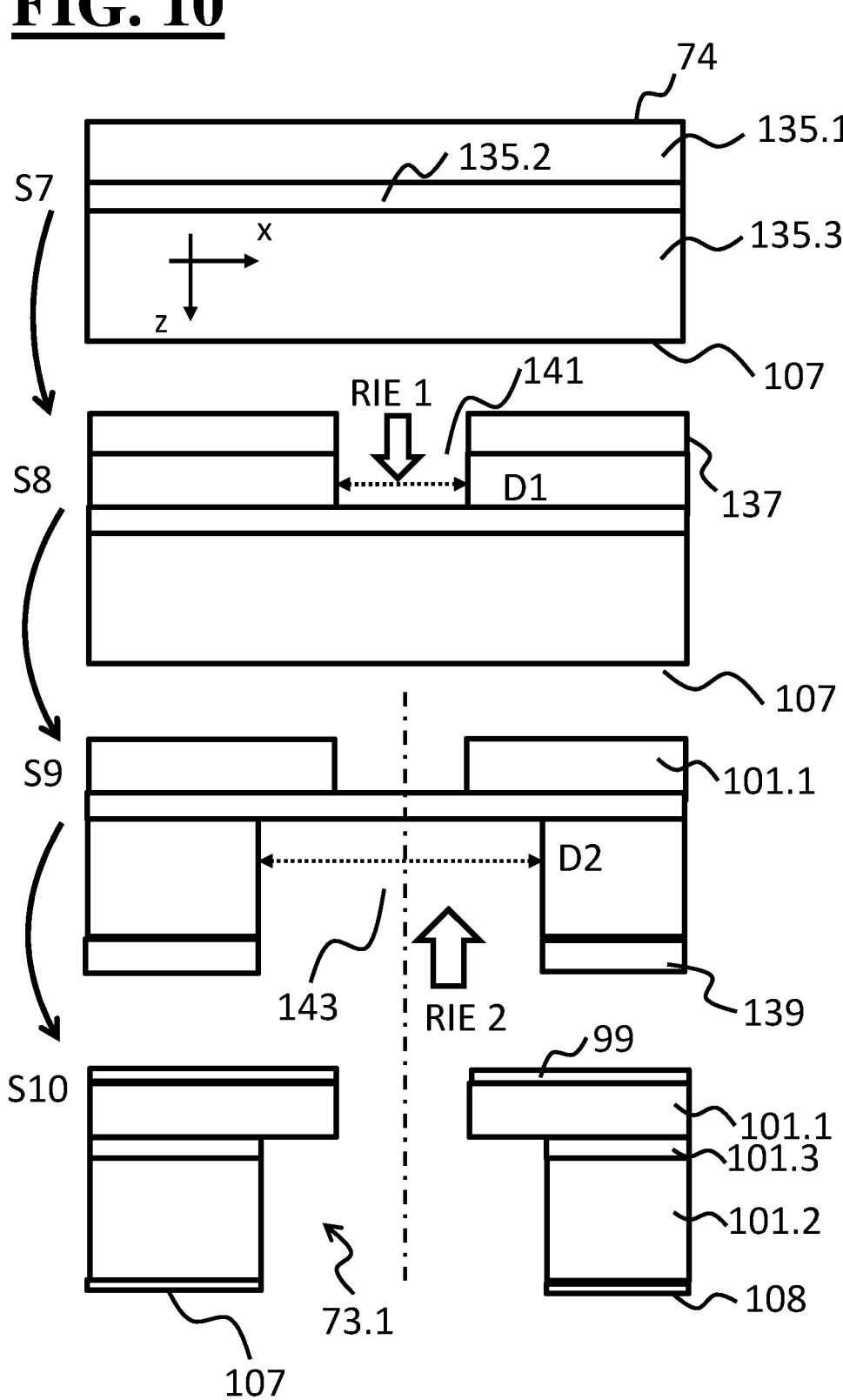
FIG. 10 shows additional or alternative steps of a fabrication method of a multi-aperture plate of a multi-beam raster unit according an embodiment.

FIG. 10 describes a method of the fabrication of the apertures of a multi-aperture plate 73.1 according to a double sided directed etch processing. In these process steps, the plurality of apertures of a multi-aperture plate 73.1 or 73.2 or 73.3 is formed in an SOI substrate by a double-sided etch process, and each of the etch-process steps is limited by the buried oxide layer of a SOI-wafer. Reference will be made to multi-aperture plate 73.1, but steps of the fabrication method may as well be applied to other multi-aperture plates 73.2 or 73.3. In the inner area or membrane zone 123 (see FIG. 8) of a multi aperture plate 73.1, 73.2 or 73.3, a wafer with layers 135.1, 135.2 and 135.3 is configured after step S7. In step 8, a first etch mask 137 is formed on the entrance side 74, and a plurality of circular openings 141 (only one shown) with diameter D1 are formed. With DRIE etching from the entrance side (RIE 1), aperture openings 141 are etched through the first layer 135.1. The second layer 135.2 acts as an etch stop layer. The first etch mask 137 is removed, and in step S9, a second etch mask 139 is formed on the back side 107, opposite to the entrance side 74. The second etch mask 139 comprises a plurality of circular openings 143 (only one shown) with diameter D2 larger than D1. Each of the circular openings 143 in the etch stop layer 135.3 is formed with lithographic precision to be concentrically with one of the circular openings 141 in the first layer 135.1. The aperture openings in the third layer 135.3 are then DRIE etched from the back or opposite side 107. In another embodiment, smaller openings are formed in the etch mask 139 and isotropic etching is applied, similar as described in step S3. After isotropic Silicon plasma etching, curved structures with the form of a segment of a sphere are formed in the device layer 135.3. The etched shape is controlled by openings (not shown), the etching time and the etch stop layer 135.2. This method employs lithography processes and etch processes from both sides of the wafer, and therefore a very precise definition of aperture openings in an entrance side as well as in an exit side of a multi aperture plate. Thereafter, in a step 10, the intermediate layer 135.2 is removed at least in the openings 141, by e.g. wet etching from the back side 107. Absorbing and conducting layer 99 is applied, as well as electrode layer 108.

A multi-aperture plate fabricated according any of steps S7 to S10 comprises in the inner zone first and second layers 135.1 and 135.3, with a third layer 135.2 of different material, for example SiO2. The membrane zone of the corresponding multi-aperture plate 73.1 thus comprises a layer of different material between first and second segment 101.1 and 101.2. In an example, a segment of an inner sidewall of at least one of the plurality of apertures has a curved shape.

FIGS. 9 and 10 illustrate a fabrication of a multi-aperture plate according an embodiment at the example of the first multi-aperture plate. The steps S1 to S10 are not to be understood as necessarily consecutive steps in order 1 to 10. Those skilled in the art understand that other sequences comprising selected steps in specific orders are possible, as well as variations to individual steps or a combination with other steps not described here. For example, electrode layer 114 is deposited in step S1 on the back or exit surface 107 of the multi-aperture plate and etched through in step S2 with the same lithography mask to form etch stop rings. In another example, absorbing layer 99 is formed at the entrance side 74 in step S7 before RIE etching of the aperture 141. With such process, several layers of a multi-aperture plate are etched at once and alignment errors between several lithographic processes and etch processes are reduced, and the performance of multi-aperture plates is further increased. Etching at once of layers of different material, e.g. comprising $SiO_2$, SiNx, Silicon, and layers of metals is based on Fluor-Plasma Etching (RIE or DRIE) as well as wet or gaseous chemical etching. In addition, alignment marks or holes as described below can be structured and fabricated together with the aperture utilizing the same lithography masks and etch process as described above. The fabrication method comprising steps S1 and S10 as described at the example of a first multi-aperture plate 73.1 is applicable as well to multi-aperture plates for use in multi-beam raster units according the embodiments of the disclosure in general.

Figure 11:
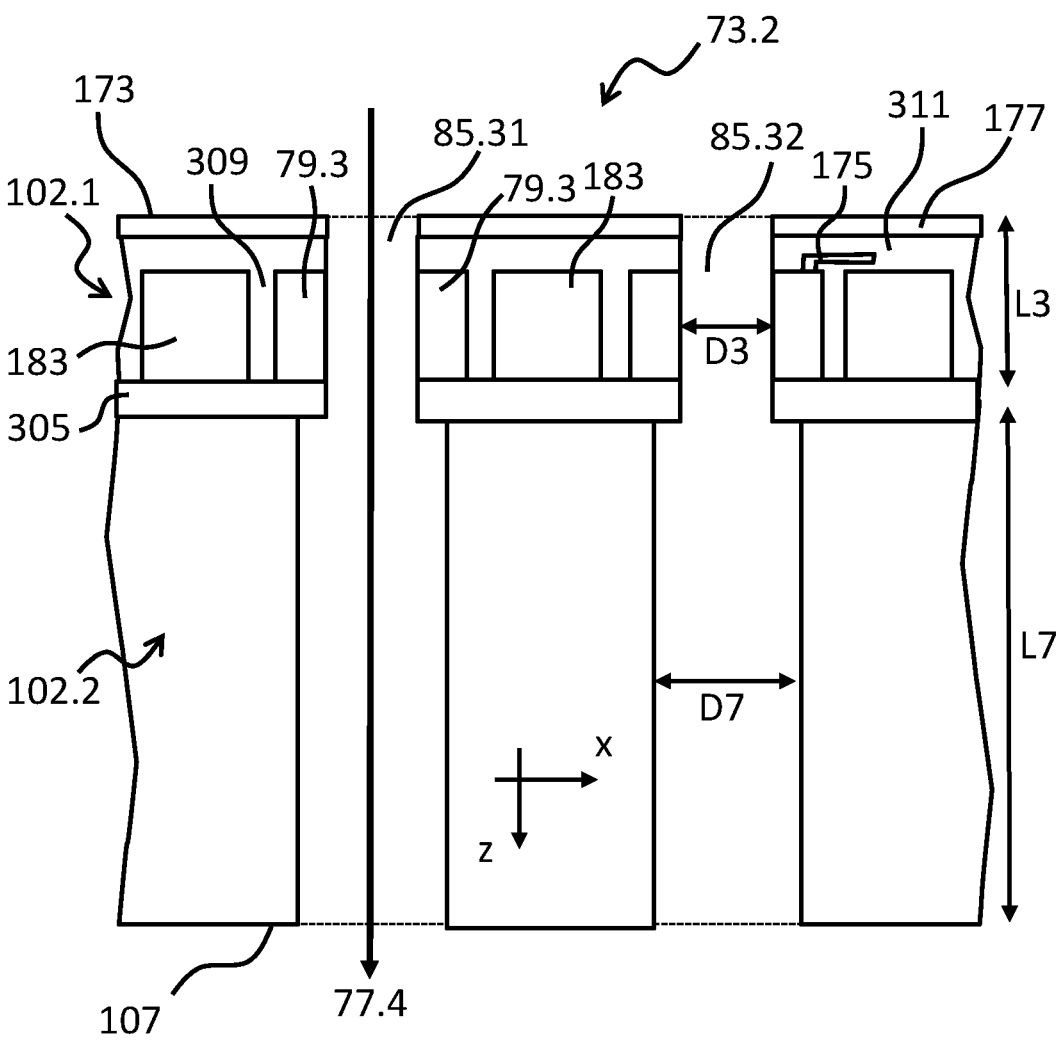
FIG. 11 shows a second multi-aperture plate according an embodiment comprising two segments.

The second multi-aperture plates according to the embodiments comprise electrodes to form during use electrostatic elements to influence the transmitting plurality of charged particle beamlets. In some embodiments, a second multi aperture plate is configures as a multi-aperture plate comprising at least a first and a second segment 102.1, 102.2, similar as the first multi-aperture plate described above. The second multi-aperture plates comprising at least a first and a second segment 102.1, 102.2 are fabricated by fabrication processes comprising process steps as described above. An example of a second multi-aperture plate 73.2 comprising at least a first and a second segment is shown in FIG. 11. The second multi-aperture plate 73.2 comprises a first segment 102.1, a second segment 102.2, both for example comprising doped silicon as bulk material, and an isolating etch stop layer 305, including for example of $SiO_2$, in between. The first segment 102.1 comprises electrodes 79.3, which are for example ring electrodes around the apertures 85.31, 85.32, connected via an electrical wiring 175 (only one shown) to a voltage supply 47.1 or 47.2 (see FIG. 1). In other examples, the second multi-aperture plate comprises multiple electrodes for stigmators or deflectors as described above. The electrodes 79.3 are isolated from the bulk material 183 by isolating gaps 309, which are filled by an isolating material such as $SiO_2$. On top of the bulk material 183, for example silicon, and electrodes 79.3, for example including metal or silicon, is an isolation layer 311, in which for example the wirings 175 are embedded and isolated. On top of the multi-aperture plate 73.2 is a shielding layer 177. The thickness L3 of the first segment 102.1 is in the range 30 $\mu m \le L3 \le 50$ $\mu m$.

The second segment 102.2, separated by isolation layer 305, has a thickness of L7 between 100 $\mu m$ and 400 $\mu m$. The apertures in the second segment of the second multi-aperture-plate 73.2 have an entrance diameter of D3 between the electrodes 79.3, and optionally a larger diameter D7 in the second segment. The isolating etch stop layer 305 allows double sided processing of apertures 85.31 and 85.32 from both sides as explained above in conjunction with fabrication steps S7 to S10. Thus, the positions and diameters of apertures are controlled with very high precision and the segments of the apertures 85.31 and 85.32 match within a precision of below 1 $\mu m$. The thick second segment 102.2 is connected to a given potential, e.g. ground level and serves as a confinement for the electrostatic field generated during use and improves the performance of the plurality of electrostatic elements, while it reduces cross talk between neighboring electrostatic elements. Bottom or beam exit side 107 is in an increased distance to electrostatic elements, and thus, during use, electrostatic fields are shielded from external negative influences in the apertures of diameters D7 of the second segment 305.

Figure 12:
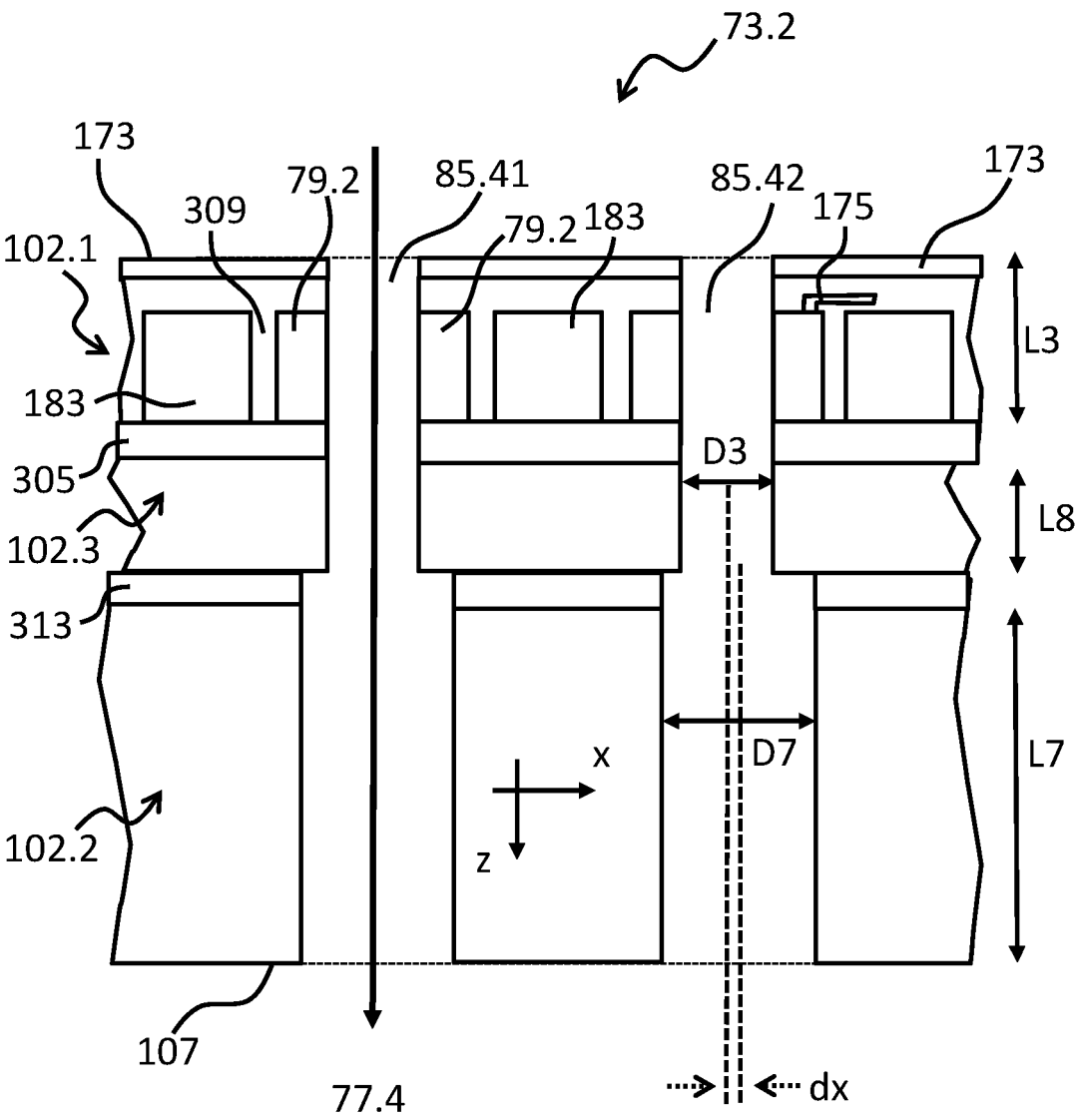
FIG. 12 shows a second multi-aperture plate according an embodiment comprising three segments.

In the double-sided processing according steps S7 to S10, residual alignment errors between the etch masks 137 and 139 for structuring both sides of the multi-aperture plate (see FIG. 10) can induce during use residual aberrations in the electrostatic elements. The residual aberrations due to alignment errors can be minimized by a third segment in the second multi-aperture plate. FIG. 12 shows an example of a second multi-aperture plate comprising at least a first and a second segment. The second multi-aperture plate 73.2 of FIG. 12 shows a first segment 102.1, a second segment 202.2, and a third segment 102.3 arranged between the first and second segment. The three segments 102.1, 102.2 and 102.3 are separated by isolation and etch stop layers 305 and 313. Fabrication process steps S7 to S10 are employed for fabrication. The third segment is etched from above to form an inner sidewall of the third segment 102.3 in conjunction with an inner sidewall of a first segment 102.1 of diameter D3. The second segment 102.2 has aperture segments with a larger diameter D7 to minimize scattering of electrons. Thickness of first segment L3 is about 30 μm to 50 μm, thickness of third segment L8 is about 20 μm to 50 μm, and thickness of third segment L7 is about 50 μm to 300 μm. Bottom or beam exit side 107 is in an increased distance to electrostatic elements, and thus, during use, electrostatic fields are shielded from external negative influences in the apertures of diameters D7 of the second segment 102.2. The configuration of the third segment 102.3 abutting the first segment 102.1 with inner sidewalls of the apertures in conjunction between first and third segment 102.1 and 102.3 improves the precision of the electrostatic elements during use, so that negative effects of a misalignment dx of about 1 μm of the aperture formation in the second segment 102.2, formed by deep back side processing, are reduced. During use, the electrostatic field extends in the aperture segment of the third segment 102.3, which is in precise conjunction with the aperture segments in the first segment 102.1 and is shielded in the third segment 102.3 from external influences. Aperture diameters D7 in the second segment 102.2 are larger than D3, for example larger by more than 10 μm, so that the misalignment dx of about 1 μm has no influence and scattering or electrons is reduced. In the examples above, the apertures 85.31 and 85.32, 85.41 and 85.42 are etched at once through at least some layers and segments formed in the second multi-aperture plate 73.2, using a single lithographic mask and dry etching steps to form the holes in the upper isolation 311, the first doped silicon layer 183, the etch-stop layer 305, and the third isolation layer 102.3. In an example, the diameter D7 of the apertures in the second segment 102.2 is identical to the aperture diameter D3 in the first segment 102.1, and the apertures 85.31 and 85.32, 85.41 and 85.42 are etched at once through the second multi-aperture plate 73.2 using a single lithographic mask and dry etching steps.

By fabrication of multi-aperture plates by two separated segments, allowing fabrication of aperture openings in the entrance side and in the exit side of a multi-aperture plate with high lithographic precision, multi-beam raster units are fabricated with high precision and less impact of fabrication inaccuracies on the optical performance of electrostatic elements. By fabrication of apertures with curved sidewalls sloping away from transmitting beamlets of charged particles, multi-beam raster unit are fabricated with high precision and less impact of fabrication errors on the optical performance of electrostatic elements. A further improvement can be achieved by an improvement of a fabrication method of the apertures. For example, in step S4, through holes 127 with cylindrical sidewalls are etched in silicon by the DRIE method and the aperture edges and sidewalls still have a roughness about ~100-500 nm rms. Scattering is reduced by the small thickness L1.1 below 10 μm, such as below 5 μm, of the first segment 101.1. In some embodiments, a method is provided to reduce the roughness of about 100 nm rms significantly by controlled smoothing of the sidewalls by thermal oxidation of Silicon surface and the removal of the formed Silicon oxide layer. By oxidation, bumps in the sidewalls with larger surface are removed. The roughness is reduced by this method of smoothing-by-oxidation by more than a factor 2. Thus, after application of the smoothing-by-oxidation-process, a surface roughness of about 100 nm is reduced to below 50 nm rms, for example 25 nm rms. First, the aperture 127 is formed by DRIE etching with a reduced aperture diameter, for example reduced by 0.5 μm-1 μm. A silicon oxide layer is formed by thermal treatment of predetermined time, and a surface layer of the silicon substrate is oxidized. The silicon oxide layer thickness is controlled by the oxidation time, and thereby for example an oxide layer of 1 μm-2 μm can be formed. The silicon oxide layer is removed by etching in HF acid and the aperture diameter in silicon is thereby increased by about 0.5-1 μm, and thereby an aperture sidewall with reduced roughness below 50 nm rms with the desired aperture diameter is achieved. In an example, the smoothing-by-oxidation can be repeated and a surface roughness of the inner sidewalls below 25 nm rms, or even below 10 nm rms is achieved. In addition, the doping and doping concentration in the sidewall and close to the sidewall surface are of the apertures is changed by oxidation. Therefore, scattering in the sidewalls of the first segment 101.1 of a multi-aperture plate of small thickness L1.1 is further reduced. The smoothing-by-oxidation can also be applied to other apertures at least in segments of the multi-aperture plates. In an example, the roughness of inner aperture sidewalls of apertures with electrodes is reduced by smoothing by oxidation, where the aberrations in the electrostatic elements during use are thus reduced.

Advanced MCPM involve complex multi-beam generating units or multi-beam deflecting units. In the embodiments of the disclosure, a multi-beam raster unit 71 such as multi-beam generating unit 27 or a deflector unit 41 is formed by stacking at least two multi-aperture plates and spacers, but advanced multi-beam generating units or multi-beam deflecting units comprise larger numbers of multi-aperture plates, for example more than 3 or even more than 5 wafers or plates stacked onto each other and have large extensions in z-direction. More than two multi-aperture elements are used for individual and precise shaping and correction of each of the plurality of transmitting charge particle beams. Examples of multi-beam generating units comprise a first multi-aperture plate, a second focusing multi aperture lens array, a third aberration correcting multi-aperture stigmator, a fourth field curvature correcting multi-aperture lens array, a fifth deflecting multi-aperture deflector to correct for telecentricity. Many different sequences of multi-aperture elements are possible, and the numbering shall not limit the sequence of the multi-aperture plate. In an example of a multi-beam generating units, a first multi-aperture plate for multi-beam generation 73.1 is arranged in sequence upstream a fourth field curvature correcting multi-aperture lens array, such as multi aperture plate 73.2, and two third aberration correcting multi-aperture stigmators, such as multi aperture plates 73.3, which act in common as stigmators and deflectors, finally followed by a focusing multi aperture lens array and global lens, such as element 84. The precise alignment between at least a first and a second wafer is achieved for example by a mechanical alignment or attachment structures provided on the first and second wafers, respectively, which engage with each other. The alignment or attachment structures are fabricated with lithographic precision and have an accuracy of below 1 μm or even below 0.5 μm. The alignment or attachment structures are formed to maintain a predefined gap between wafers, such as for example to maintain a predefined distance L2 between a lower or bottom surface of a first multi-aperture plate 73.1 and second multi-aperture plate 73.2. In some embodiments, a multi-beam generating unit or multi-beam deflector unit comprises spacers to define for example a distance L2 with high precision. For example, multi-beam generating unit comprises four spacers of 10 μm thickness. The separation S between a multi aperture plate and subsequent multi aperture plate is thus maintained in a given range S ($10\,\mu m \leq S \leq 30\,\mu m$) with high accuracy below 1 μm, or even below 0.5 μm.

Figure 13:
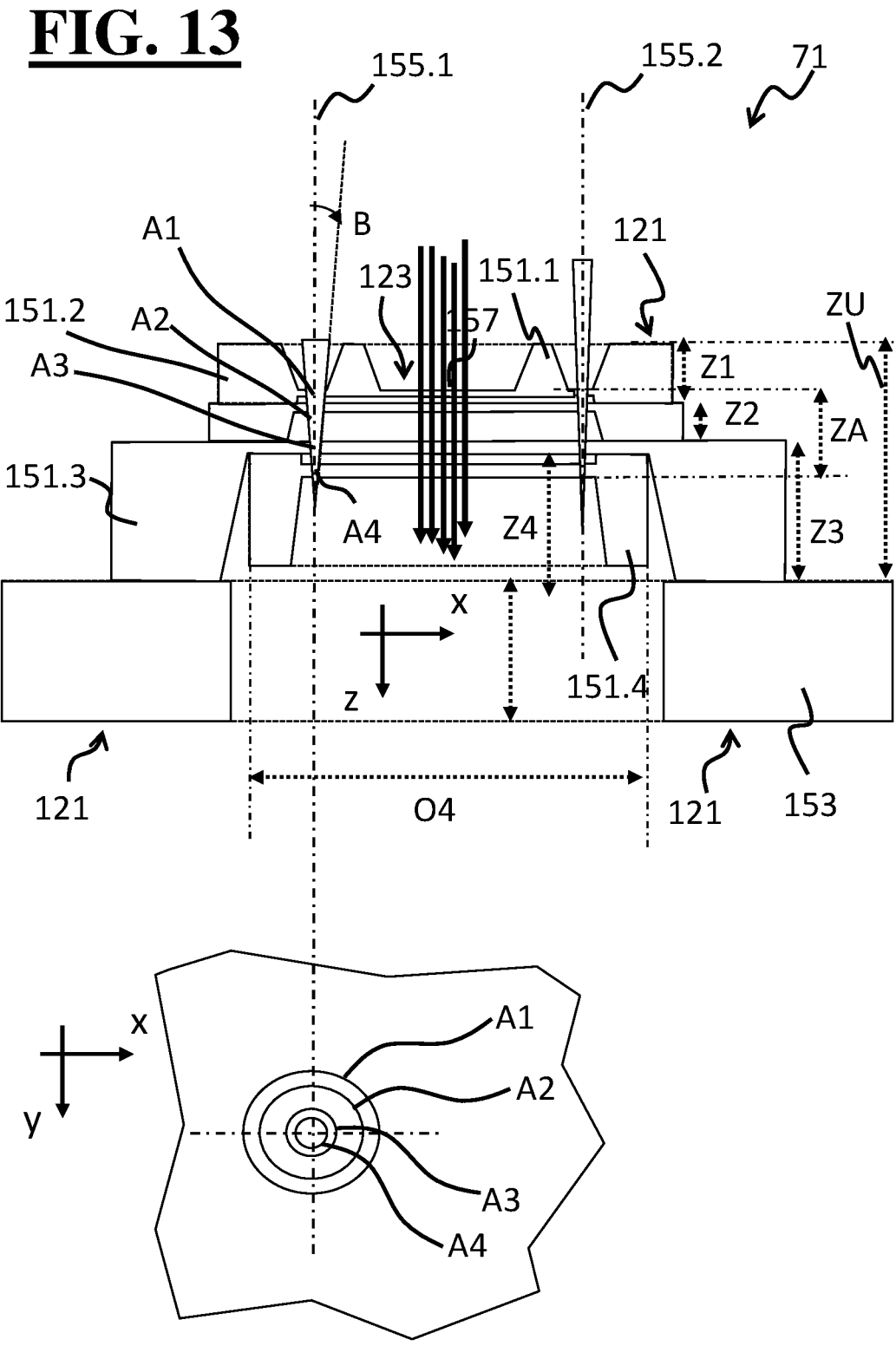
FIG. 13 shows assembly and alignment structures of a multi-aperture plate of a multi-beam raster unit according an embodiment.

In some embodiments, a lateral precision alignment with lateral accuracy below 1 μm is achieved by active 3D alignment of a plurality of multi aperture plates. The z positions and z-distances of the wafers in the stack can be precisely controlled by planar fabrication of the wafers and with spacers, the lateral alignment transverse to the transmitting charged particle beams is obtained by lateral active alignment and fixation in the aligned state. Active alignment can be achieved by lateral displacement of the wafers forming the multi-aperture plates for example by help of 3D alignment marks extending over large z-distance. FIG. 13 illustrates the embodiment at an example. A multi-beam raster unit 71 such as a multi-beam generating unit or multi-beam deflecting unit comprises 4 multi-aperture plates 151.1 to 151.4, which are for example fabricated as described according to one of the above embodiments, and a support unit 153. At least some of the multi-aperture plates 151.1 to 151.4 have an inner zone forming a membrane 123 of thickness about 10 μm-50 μm, with a plurality of apertures 157 (only five shown), and a support zone 121 around each inner zone 123. Each supporting zone 121 of each multi-aperture plate 151.1 to 151.4 has a z-extension Z1 to Z4 in direction of the transmitting charged particle beam, of which each is in the order of 100 μm or even more. The multi-aperture plates 151.1 to 151.4 are attached to each other in a specific order and with mechanical precision, which is in the order of few μm in lateral position. In order to achieve a more precise alignment, at least each subsequent pair of the multi-aperture plates 151.1 to 151.4 comprises at least two alignment holes A1 to A4 or alignment marks, fabricated with precision of lithography processes along at least two alignment axes 155.1 and 155.2. The diameters A1 to A4 are selected between 50 μm to 200 μm. The thickness of the membranes in the inner zone and the thickness of the spacers for each multi aperture plate is between 10 μm and about 100 μm. By configuring the multi-aperture plates with thin membranes in the inner zone 157 and support zones 121 of different diameters, the multi-aperture plates 151.1 to 151.4 can be stacked with small distances of the membranes, and the z-extension ZA between the first alignment hole A1 and the last alignment hole A4 is between 75 μm and several 100 μm. In this example, the diameter O4 of the fourth aperture plate 151.4 is configured small, such that fourth aperture plate 151.4 can be attached to the membrane of the third multi-aperture plate 151.3. Third multi-aperture plate 151.3 is first attached to the second multi-aperture plate 151.2 to achieve a higher mechanical stability of the membrane of the third multi-aperture plate 151.3. After that, the fourth multi-aperture plate 151.4 is attached to the membrane of the third multi-aperture plate 151.3 of enhanced stability. The alignment holes A1 to A4 are thus shaped in a way to allow deep optical alignment with high precision. A precision alignment in the order of 1 μm involves with conventional wavelengths of 0.5-0.65 μm for alignment an optical numerical aperture (NA) of 0.35, corresponding to large numerical apertures with very low depth of focus below few micrometers. Therefore, conventional high precision alignment techniques cannot be employed for multi-aperture plates with large z-distances. The diameters A1 to A4 and positions of alignment apertures are thus selected to allow deep optical precision alignment of the lowest multi aperture plate 151.4 through the upper multi aperture plates 151.1 to 151.3 with precision better than 1 μm, such as 0.5 μm, with optical microscopes having a low NA about 0.1 and below with depth of focus larger than 30 μm, for example 75 μm with NA below 0.07. The aperture diameters A1 to A4 thus increase in reverse order from A4 to A1 and allow for example for a half opening angle B limited to about 6°-8°. In looking in z-direction through the alignment axes with an optical microscope, apertures A1 to A4 are visible and a precision alignment can be achieved, even though the alignment apertures A1 to A4 extend over large distance ZA, and even the resolution of the microscope only is in the order of few μm, for example 3 μm. The lateral precision of 1 μm or even 0.5 μm is obtained by edge detection and image processing to the images of the circular apertures with diameter A1 to A4, which are formed with lithographic precision with an accuracy better than 100 nm. The centers of the circular apertures A1 to A4 are thus extracted with high accuracy. The lateral alignment is performed by lateral movement via precision actuators under optical monitoring, until concentric rings formed by the precisely aligned holes A1 to A4 are achieved. This is illustrated simplified in the lower part of FIG. 13.

Figure 14:
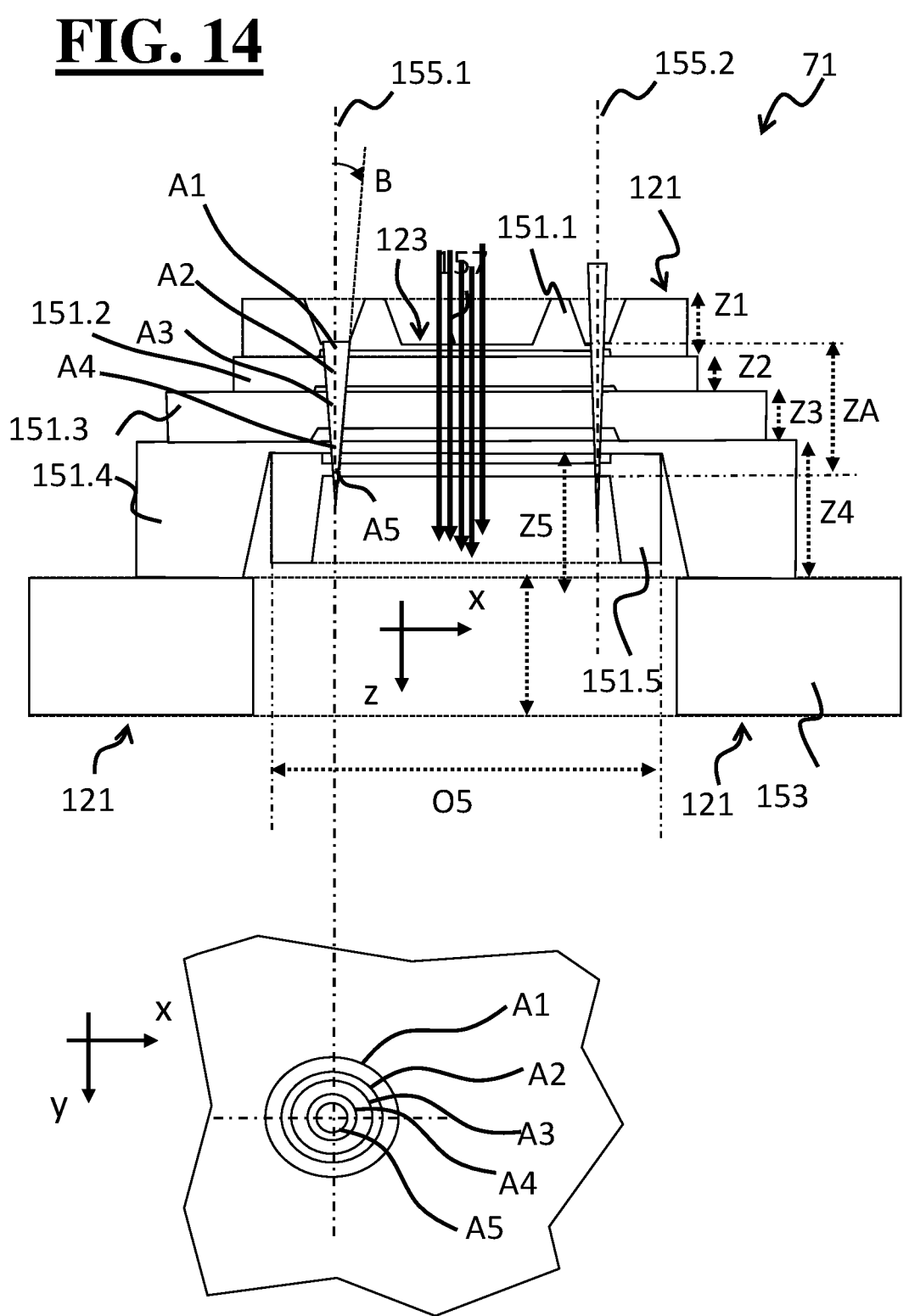
FIG. 14 shows assembly and alignment structures a multi-aperture plates of a multi-beam raster unit according an example of the embodiment.
Figure 15:
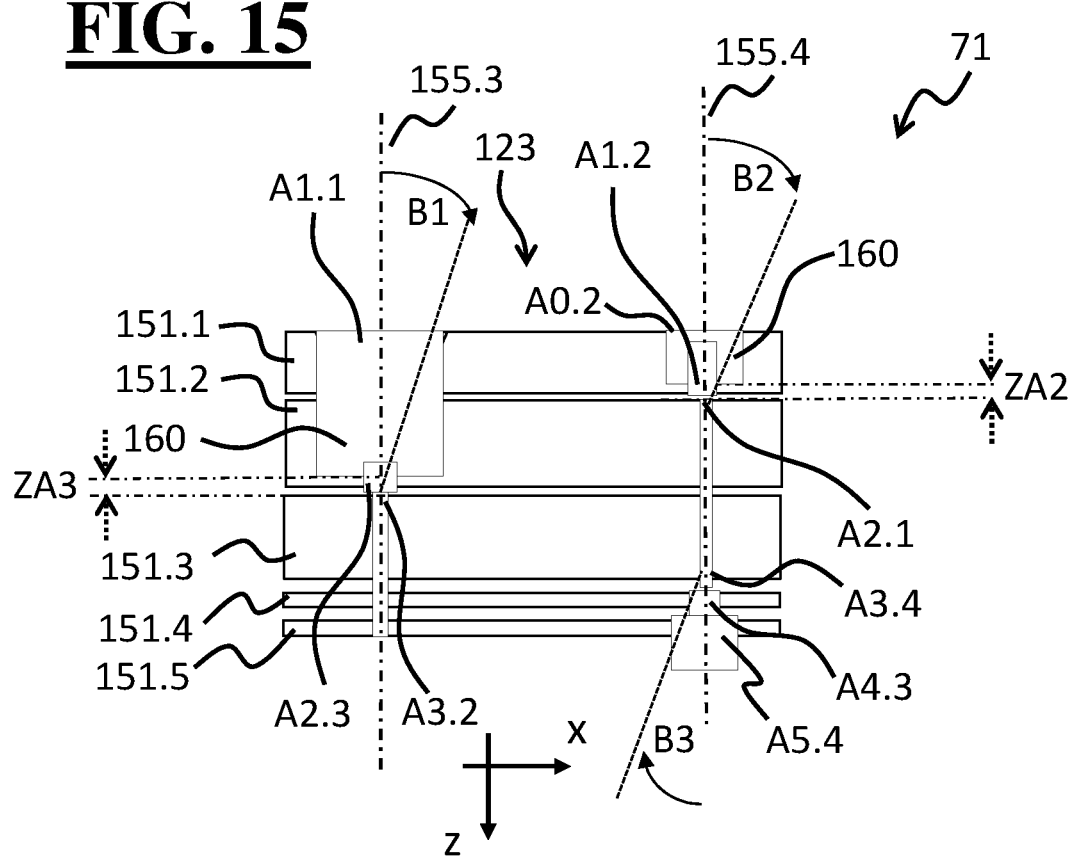
FIG. 15 shows details of alignment structures of a multi-beam raster unit according an embodiment.

FIG. 14 illustrates another example of the embodiment. A multi-beam raster unit 71 multi-beam generating unit or multi-beam deflecting unit comprises five multi-aperture plates 151.1 to 151.5, which are for example fabricated as described according to one of the above embodiments, and a support unit 153. At least some of the multi-aperture plates 151.1 to 151.5 have an inner zone 123 forming a membrane of thickness about 10 μm-50 μm, with a plurality of apertures 157 (only five shown), and a support zone 121 around each inner zone 123. Each supporting zone of each multi-aperture plate 151.1 to 151.5 has a z-extension Z1 to Z5 in direction of the transmitting charged particle beam, of which each is in the order of 100 μm or even more. The multi-beam generating units or multi-beam deflecting units 71 comprises at least on multi-aperture plate with a thick membrane, such as multi-aperture plate 151.3 of FIG. 14, with thickness above 100 μm, for example 400 μm, as for example a second multi-aperture plate 73.2 according to the examples explained in conjunction with FIGS. 11 and 12. The thickness of the other membranes in the inner zone and the thickness of the spacers for each multi aperture plate is between 15 μm and about 100 μm. To achieve a more precise alignment, each of the multi-aperture plates 151.1 to 151.5 comprises at least two alignment holes A1 to A5, fabricated with precision of lithography processes along at least two alignment axes 155.1 and 155.2. The alignment holes A1 to A5 are shaped in a way to allow deep optical alignment with high precision. The diameters A1 to A5 and positions of alignment apertures are thus selected to allow deep optical precision alignment. The lateral alignment is performed by lateral movement via precision actuators under optical monitoring, until concentric rings formed by the precisely aligned holes A1 to A5 are achieved. This is illustrated simplified in the lower part of FIG. 14. Several alignment holes can be placed in parallel to achieve alignment in two lateral coordinates as well as an individual precision alignment between selected multi aperture plates. For example, two or more alignment holes or marks, for example including opposite alignment structures, are provided containing at least one circular hole as described with reference to FIG. 13 and FIG. 14, which are etched through at least two of the multi-aperture plates by lithographic precision, with increasing hole diameter in at least two multi-aperture plates in direction of the alignment axis. Since a precision alignment with image processing involves aperture diameters to fit into an image field of a microscope, the conical opening for observation desirably allows opening angles corresponding to the numerical aperture of the microscope, for example with half opening angle larger than 6°, the diameters of see-through holes in upper multi-aperture plates can be too large for an alignment of the upper multi-aperture plates with sufficient precision below 1 μm. If the diameters A2 and A3 of the multi aperture plates 151.2 and 151.3 for deep alignment of lower multi aperture plates 151.4 and 151.5 are too large for a precision lateral alignment, second alignment structures of smaller diameter A1 and A2 are provided for alignment of upper multi aperture plates 151.2 and 151.3 in parallel to the first holes for alignment of deeper multi aperture plates 151.4 and 151.5. An example is illustrated in FIG. 15. Two lower multi aperture plates 151.2 and 151.3 are mutually aligned at alignment axis 155.3 from above (in positive z-direction) with large holes through multi-aperture plate 151.1 with large hole diameter A1.1 and an abatement or lowering 160 in the thick second Multi-aperture plate 151.2 with large hole diameter A1.1 to reduce the z-distance ZA3 of the alignment marks of diameter A2.3 and A3.2 to be below 30 μm, allowing a mutual optical alignment of the deep alignment edges of multi-aperture plates 151.2 and 151.3 with z-distance about 30 μm with half opening angle of B1 about 8° and lateral precision below 1 μm. The first two, upper multi aperture plates 151.1 and 151.2, which involve for example very precise lateral alignment with lateral precision of about 0.5 μm, comprise additional alignment marks of diameter A1.2 and A2.1 at a second alignment axis 155.4, for alignment of the first and second multi-aperture plate only. The first multi-aperture plate also has a first abatement or lowering 160 to reduce the z-distance ZA2 of the alignment marks of diameter A1.2 and A2.1 to be below 30 μm. A larger opening angle B2 of about 10° is enabled by the abatement or lowering 160 with larger diameter A0.2. A third mutual alignment of the lower multi-aperture plates 151.3 and 151.4 can be achieved from the backside, by optical alignment in negative z-direction of the coordinate system indicated in of FIG. 15, with alignment marks of diameter A3.4 and A4.3. For alignment from the back side, alignment mark diameter A3.4 of multi-aperture plate 151.3 is selected to be smaller as alignment mark diameter A4.3 of the multi-aperture plate 151.4, and alignment mark diameter A4.3 of the multi-aperture plate 151.4 is selected smaller than see through hole of diameter A5.4 in the lower multi-aperture plate 151.5, allowing a half opening angle of B3 about 8° for 3D mutual optical alignment of multi-aperture plate 151.3 and multi-aperture plate 151.4 with precision about 1 μm. An alignment from the back or lower side is advantageous, if for example the exit side of a multi-aperture plate is covered by a metallic film with higher reflectivity compared to Silicon or SOI. In an example, the surface of a second multi-aperture plate, to which a first multi-aperture plate with an alignment hole of diameter A1 is aligned, contains an alignment mark such as circular hole or a reflective (metallic) structure with a diameter A2 smaller than the diameter A1. A reflective structure, for example a circular structure, ensures higher contrast and brightness and allows alignment in deep alignment holes. After lateral 3D alignment with a precision of 1 μm or below is achieved, at least pairs of multi-aperture plates or the whole stack of multi-aperture plates are fixed by fixation techniques such as by clamping, gluing, or adhesion bonding. With directed etch processes, each hole is axisymmetric (along the hole axis) and parallel to the alignment axis, which is in the coordinate system indicated in FIGS. 13 and 14 parallel to the z-axis. 3D alignment structures are provided at at least two positions of the multi-aperture plates to allow alignment in lateral direction as well as rotation.

After design, fabrication and assembly according one of the embodiments described above, the multi-beam raster unit are fabricated with high precision and less impact of fabrication inaccuracies and deviations on the optical performance of electrostatic elements. However, the optical performance of electrostatic elements is diminished during use for example bending or deformations of the membranes during use, leading to for example a curvature of the focus plane of the plurality of charged particle beamlets or a deviation from the telecentricity properties of the plurality of beamlets. Telecentricity properties are in general the beam aiming of each of the plurality of beamlets. Perfect bundles of beamlets are either homocentric or telecentric, meaning the plurality of beamlets either converge to or diverge from a single point of coincidence. Strictly speaking, telecentricity means that the point of convergence is at infinity and the beamlets are all propagating in parallel, for example parallel to z-direction. Deviations from the telecentricity properties are deviations of individual beamlets from a predefined point of coincidence. A multi-beam raster unit is designed for a specific shape of field plane 29, for example a planar shape or spherical shape, or for a specific telecentricity property, for example a plurality of perfectly parallel beamlets or a plurality of beamlets with a predefined point of coincidence. In some embodiments, a multi-beam raster unit comprises deformable membranes with passive or active deformation of the membranes to achieve the predefined shape of field plane 29, or specific telecentricity property. With capacitive sensors, membrane deformation induced for example by thermal effects or active membrane deformation as described below can be monitored.

Passive deformation is for example achieved by application of coatings of specific thickness. Coatings contribute an either compressive of expansive stress to a coated element, and a coated element is deformed either convex or concave. According to an embodiment of the disclosure, a deformation of a multi-aperture-plate is measured after fabrication, and a film thickness of a stress compensating film is determined to introduce a specific amount of deformation to the multi-aperture plate. The film is deposited on the multi-aperture plate and thereby an unwanted deformation is compensated for or a predetermined deformation is achieved in the multi-aperture plate. Stress compensating layers can be for example layers of SiNx with thickness between 100 nm-1 μm. By this method of stress engineering with an additional stress compensating layer, passive deformations between 20 μm-30 μm with a precision below few 1 μm, for example below 1 μm, in z-direction are achieved.

In some embodiments, active deformation is achieved by electrodes on at least two multi-aperture plates or using existing electrodes and an application of a voltage difference to the electrodes to deform at least one of the membranes in the inner zone of one multi-aperture plate. In another embodiment an active deformation of a membrane of a multiple-aperture plate is be achieved by heating or cooling of a membrane with a layer of different thermal expansion, such as a metal layer. In another example, active deformation of a membrane comprising apertures or electrodes to form electrostatic elements is are achieved by actuators in the support zone of the membrane, which generate, during use, bending forces to the membrane in the inner zone of a multi-aperture plate. Thereby, during use, an active deformation between 20 μm-30 μm with a precision below 1 μm in z-direction is achieved.

Figure 16:
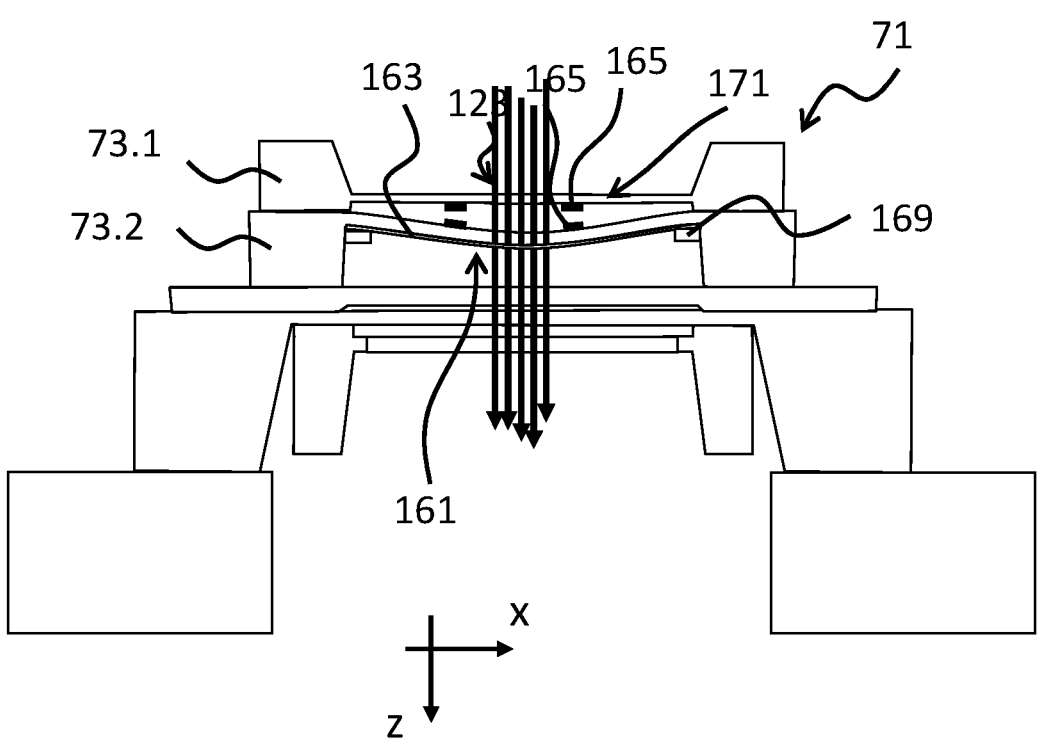
FIG. 16 shows a multi-beam raster unit according an embodiment with a multi-aperture plate with a membrane with predetermined and actively controlled deformation.

FIG. 16 illustrates an example of a deformed membrane 161 with deformation control. In the multi-beam raster unit 71, the membrane 161 of the second multi-aperture plate 73.2 is deformed in the inner zone 123 according a predefined deformation to achieve a field curvature. A design deformation is achieved by SiNx-coating 163 of predetermined thickness by stress engineering. Capacitive sensors 165 monitor the deformation of the membrane 161 in the inner zone 161 of the second multi aperture plate 73.2, thereby controlling the distance to the membrane 171 of first multi-aperture plate 73.1. During use, the deformation is changed by actuators 169, for example piezo actuators, which introduce bending forces to the outer periphery of the membrane 161. Thereby a design field curvature is obtained and maintained during use by passive and active deformation of a membrane 161.

Figure 17:
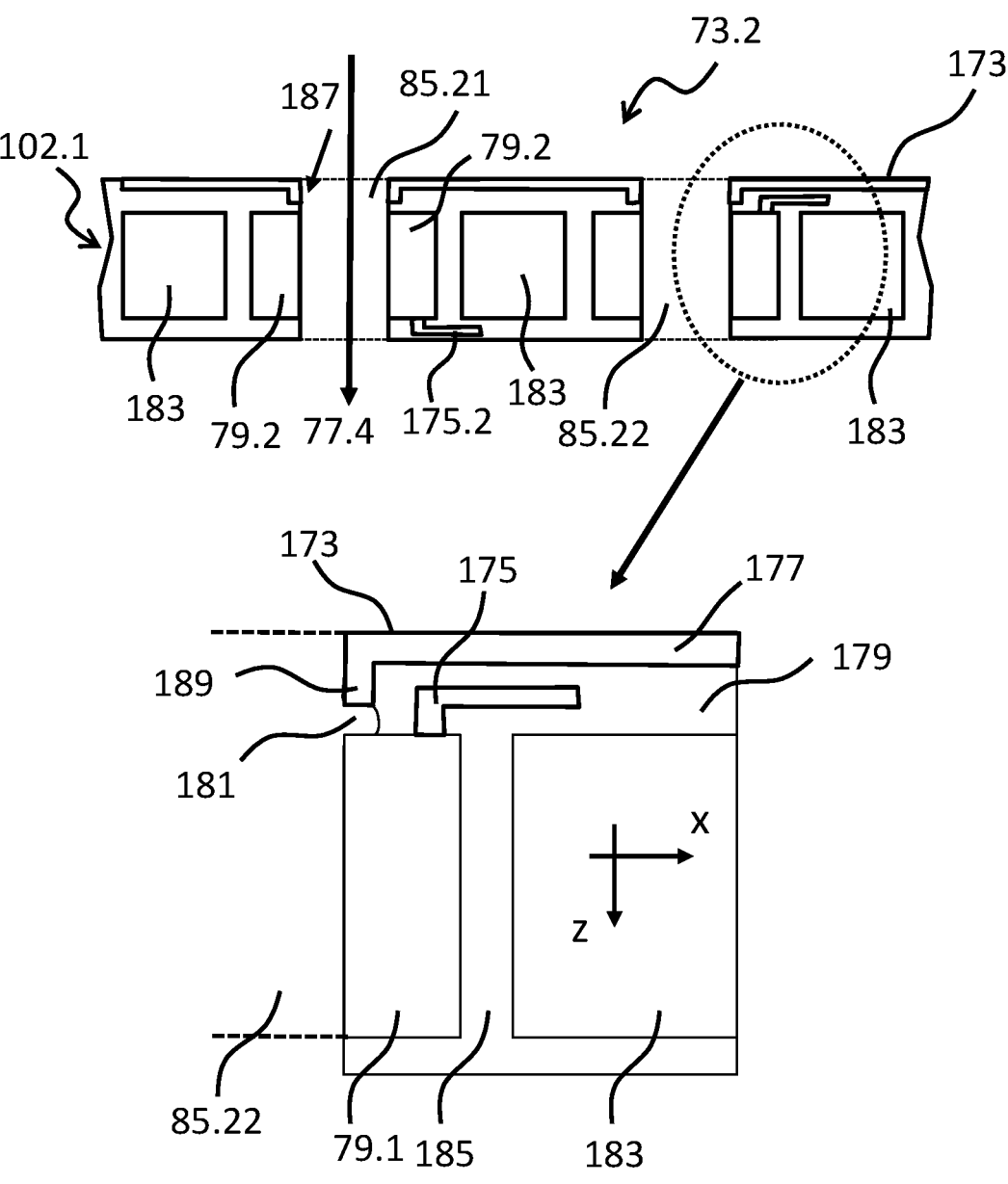
FIG. 17 shows a multi-aperture plate with a shielding layer.

During use, an incident beam of charged particles is either absorbed at the first multi-aperture plate or transmits the plurality of apertures, and a plurality of beamlets is formed. The plurality of beamlets passes the plurality of apertures of the plurality of subsequent multi-aperture plates and each beamlet is focused, aberration corrected or deflected in a predetermined way by electrostatic elements as described above. Even with the improvements of the design and fabrication as described above, still some charged particles are scattered and absorbed at for example the upper or beam entrance surface or the inner sidewalls of an aperture of a second or third multi-aperture plate. Scattered charged particle can generate x-rays. During use, absorbed charged particles or x-rays produce for example surface charges in isolators, which have a negative influence on the electrostatic elements and therefore introduce aberrations. In a further improvement of the embodiments of the disclosure, a design and fabrication method to mitigate absorption of charged particles is provided. According to the improvement, conductive layers are provided at the beam entrance side of second and further subsequent multi-aperture plates of a multi-beam raster unit, and in addition to the conductive and absorbing layer 99 at the beam entrance side of the first multi-aperture plate. In an example, the insulators of the electrostatic elements, which are situated near the edges of the plurality of apertures and serve to isolate the electrodes, the wiring connection and the substrate, are shielded with conductive shielding layers. An example is illustrated in FIG. 17 at the example of a first segment 102.1 of the second multi-aperture plate 73.2. The second multi-aperture plate 73.2 comprises a inner zone or membrane with a plurality of apertures 85.21 and 85.22 (only two shown) and ring electrodes 79 and 79.2 arranged around the apertures 85.21 and 85.22. The apertures are in alignment with the plurality of apertures of a first multi-aperture plate to transmit the plurality of charged particle beamlets 77.4 (only one shown). The ring electrodes are isolated via isolation gaps 185 from the bulk silicon or SOI substrate 183, for example by isolating material silicon oxide. Each ring-shaped electrode 79, 79.5 is electrically connected to a voltage supply via electrical wiring 175, 175.2 to a voltage support (not shown) and isolated by isolation material 179 from the substrate 183, for example silicon oxide. The wiring connections 175, 175.2 can be from the upper or from the lower side of the second multi-aperture plate or alternating from both sides from electrode to electrode. The isolation material 179 extends above the wiring 175, such that the wiring 175, the electrode 70 and the bulk material 183 are completely covered at the upper side. The inner sidewalls of the electrodes 79 are not covered by isolation material 179. Above the isolation material, a conductive shielding layer 177 is formed, which forms the beam entrance or upper surface 173 of the second multi-aperture plate. The conductive layer extends into the apertures with plunging extensions 189 and a small isolation gap 181 is formed between conductive shielding layer 177 and electrode 79.1, thereby conductive layer 177 is isolated from electrode 79.1. Conductive layer 177 is connected to a huge capacity, for example to ground (U=0V). During use, scattered charged particles 187 are thus absorbed by conductive shielding layer 177 and conducted away and disturbing surface charges are avoided. With the conductive layer 177 connected to a large capacity, stable electrostatic elements are generated during use. Surface charges in the small isolation gap 181 disappear due to the small distance of the isolation gap 181. Thereby, surface charges during use are reduced to less than 10% compared to conventional second multi-aperture plates. After passing the first multi-aperture plate, any scattered and secondary particles formed by the transmitting charged particle beamlets 77 have a lower kinetic energy, and the conductive shielding layer 177 made of metal, for example Aluminum, with lower thickness or density compared to the conductive layer 99 of the first multi-aperture plate 73.1, scattered charged particles are absorbed and guided away. In an example, the multilayer electrode 79 and shielding layer 177 of electrostatic elements are realized by the "etching at ones" approach, employing a single sequence of dry etching processes using one and the same etch mask with apertures corresponding to the apertures 85.2 (two apertures 85.21 and 85.22 shown in FIG. 17). Thereby, precise fabrication of the shielding layer 177 with plunging extensions 189 in alignment with the inner walls of the electrodes 79 is provided, and a plurality of electrostatic elements is provided, during use, with high repeatability and no additional astigmatism or shift of the charged particle beam is introduced by misalignment of the plunging extensions 189 to the electrodes 79.

In an alternative configuration, apertures through the electrodes 79 are formed first and the roughness of the inner sidewalls is reduced by the smoothing-by-oxidation-process described above and the etching of the shielding layer 177 is performed from the backside of the second multi aperture plate 73.2. By providing conductive shielding layer 177 with an extension plunging into an aperture of the second multi-aperture plate with high precision, and forming a small gap to the electrodes, electrostatic elements are generated, during use, with higher precision and stability, and aberrations are reduced.

Figure 18:
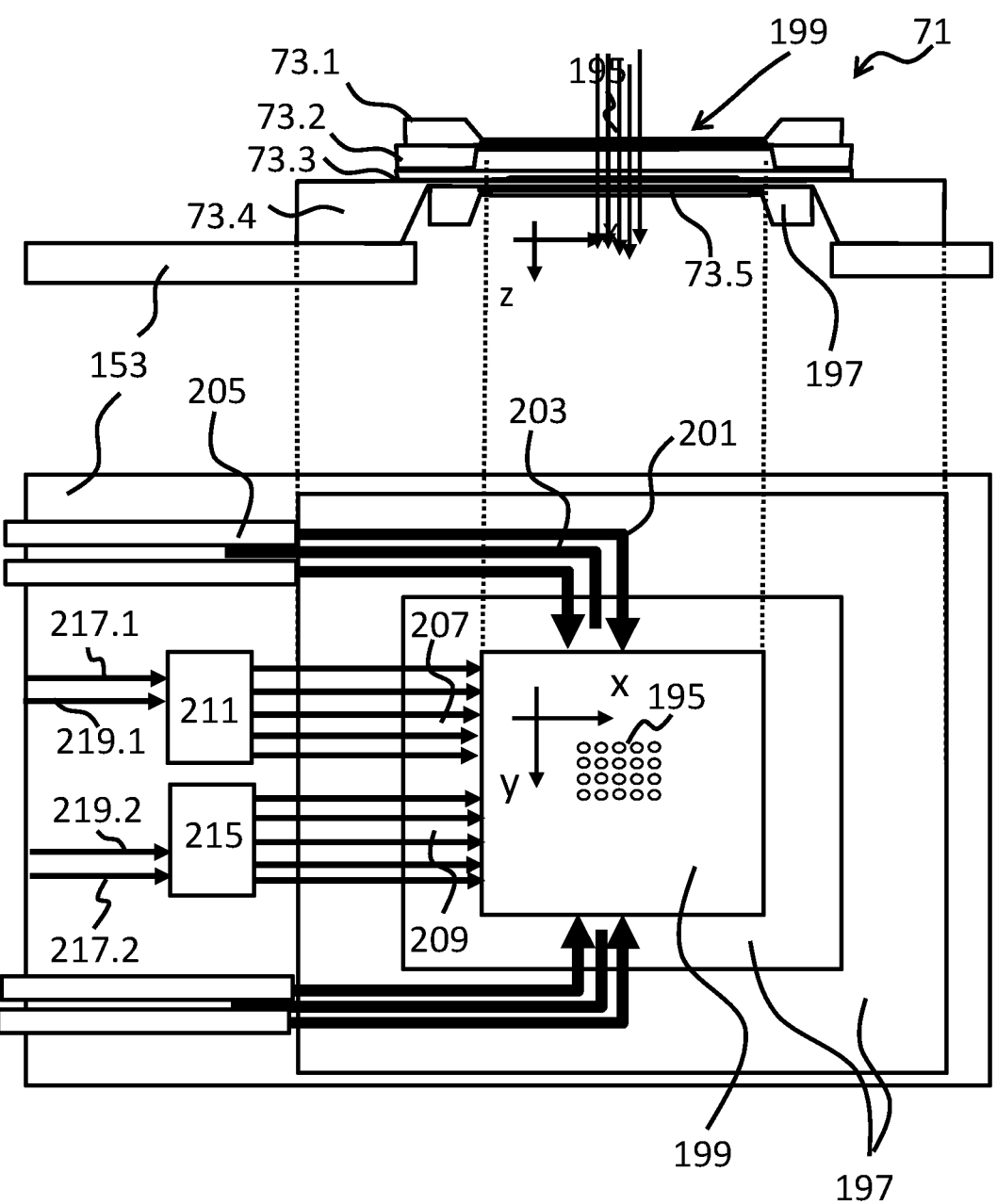
FIG. 18 shows a multi-beam raster unit according an embodiment with signal and voltage supply wiring lines from orthogonal directions.

To enhance the performance of the multi-beam charged particle microscope during use, each of the plurality of charged particle beamlets is individually controlled, for example by individual focus correction with a plurality of individually controlled ring electrodes 79, or a plurality of individually controlled electrodes of stigmators or deflectors. The individual control of the plurality of electrodes is provided by wirings, additional wirings are provided for shielding and absorbing layers described above, for capacitive sensors and actuators described above, or other sensors. One multi-beam raster unit for a plurality of for example 100 beamlets comprises about 1000 or more electrodes, with about 1000 or more than 1000 individual wiring connections. The electrodes and shielding or absorbing layers involve drive voltages with differences of orders of magnitude, for example between 10V up to 1 kV. For example, multi focus correction involves 100 high voltage wirings for about 200V and multi astigmatism correction involve for example 800 low voltage wirings for few volts with very low noise, and an absorbing layer produces a high current. Wirings with such voltage differences can easily influence each other and thereby diminish the performance of a multi-beam raster unit. In some embodiments, a multi-beam raster unit comprises design features and structures to minimize influences of the voltage differences. A multi-beam raster unit comprises a mixed signal architecture for different voltages and currents. High voltages are provided by an external controller. Low voltages provided by ASICs placed inside the vacuum with digital interface to an external controller. The routing of signals and voltage supply is obtained via a UHV-Flange. A separation of the wirings with different voltages is achieved by supply of the voltages from different directions. With the first direction (the z-direction) of the transmitting charged particle beamlets, for example the low voltages are supplied from a second direction (the x-direction), and the high voltage is supplied from a third direction. The high current connection to the absorbing layer can be provided from a forth direction, for example from the z-direction or parallel from the third direction. All wirings can be individually shielded, or the low voltage supply wirings can be shielded in groups of low voltage wirings. The fewer high voltage wirings can be provided with a larger distance. In some embodiments, wiring connections to ring electrodes for electrostatic lenses are provided from the upper and lower sides alternating from electrode to electrode, to keep the distance between wirings as large as possible. FIG. 18 illustrates the embodiment at one example. A multi-beam raster unit 71, comprising 5 multi-aperture plates 73.1 to 73.5, each with a parallel arranged membrane in membrane zone 199 and a support structures in a support zone 197, is mounted on a support board 153. Via the support structures and the support board, high voltage wiring connections 201 are provided in positive as well as negative y-direction to the ring electrodes of the electrostatic lenses in at least one of the multi-aperture plates with the plurality of apertures 195 (only 4×5 shown, can be 91, 100, 300 or more). The high-voltage wiring connects are shielded by ground line 203, which is connected to ground. In a peripheral area, the high voltage wirings are shielded by coaxial shielding and isolation 205 (four high-voltage wiring connects, and coaxial shielding are shown, only one indicated by reference numbers 201 and 205). Low voltage wiring connections 207 and 209 for electrostatic stigmators and deflectors are provided from both x-directions (only positive direction shown) from ASICS 211 and 215 mounted on the support board 153. The low voltage wirings are also shielded from each other by ground wirings (not shown) between the low voltage wirings. ASICS get digital signal via digital signal line 217.1 and 217.2, as well as power supply by low voltage supply lines 219.1 and 219.2. Thereby, high voltage and low voltage signals are separates as much as possible and negative influence of mutual induction of leakage is reduced and a more reliable optical performance of the multi-beam raster unit is achieved.

Figure 19:
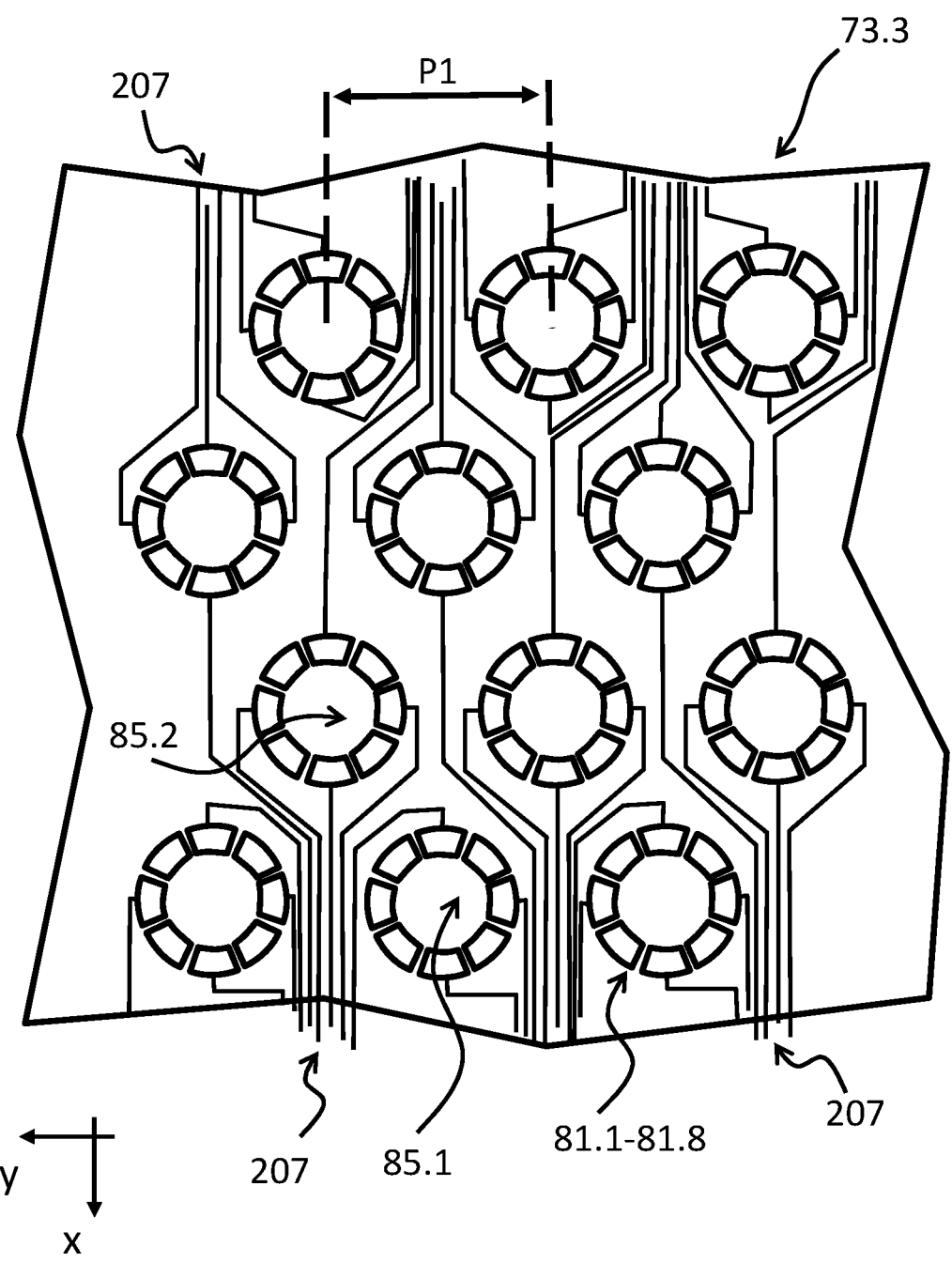
FIG. 19 shows an example of a voltage supply to the plurality of electrodes of a multi-aperture plate.

FIG. 19 illustrates schematically the plurality of low voltage wiring connections 107 of multi-aperture plate 73.3, comprising a plurality of stigmators of deflectors, formed during use by eight electrodes 81.1 . . . 81.8 for each of the plurality of apertures 85 (only two indicated by reference numbers 85.1 and 85.2) in a hexagonal raster configuration with pitch P1. The electrodes under 0°, 90°, 180° and under 270°-orientation are connected to the peripheral ASICS 211, 215 (see FIG. 18) in the x-direction and on the beam entrance side of multi aperture plate 73.1, which is illustrated in FIG. 19. The correcting electrodes under 45°, 135°, 225° and under 315°-orientation are connected to the peripheral ASICS 211, 215 (see FIG. 18) in the x-direction on the back side or a different layer of multi-aperture plate 73.3, thus not visible in FIG. 19. During use, a plurality of low voltages in the range of 5V-100V is applied to the plurality of electrodes from the x-direction. The low voltages are separated from large voltages applied for example to a first multi-aperture plate, for which the large voltage is supplied in the y-direction.

The multi-beam raster units of the embodiments are described in the illumination beam path with charged particles propagating in positive z-direction with the z-direction pointing downwards. However, multi-beam raster units can also be applied in the imaging beam path, with charged particle beamlets propagating in negative z-direction in the coordinate system of FIG. 1. Still, the sequence of multi-aperture plates is arranged in sequence in the propagating direction of the transmitting charged particle beam or beamlets. With beam entrance side or upper side is understood the first surface or side of an element in the direction of the transmitting charged particle beam or beamlets, with bottom side or beam exiting side is understood the last surface or side of an element in the direction of the transmitting charged particle beam or beamlets.

While the multi-beam raster unit according the disclosure are described in some of some embodiments as multi-beam generation unit, the features of the embodiments are applicable as well to other multi-beam raster units according the disclosure, such as a multi-beam deflector or multi-beam stigmator unit.

The features of the embodiments improve the performance of multi-beam charged particle microscopes to achieve higher resolution of below 5 nm, such as below 3 nm, for example below 2 nm or even below 1 nm. The improvements are of special relevance for a further development of multi-beam charged particle microscopes with larger numbers of the plurality of beamlets such as more than 100 beamlets, more than 300 beamlets, more than 1000 beamlets or even more than 10000 beamlets. Such multi-beam charged particle microscopes involve multi-aperture plates with larger diameter and a larger plurality of apertures and electrodes, including for example even more wiring connections. The improvements are of special relevance for routine applications of multi-beam charged particle microscopes, for example in semiconductor inspection and review, where high reliability and high reproducibility and low machine-to-machine deviations are used.

The embodiments provide a charged particle beam system which operates with a multiplicity of charged particle beams and can be used to achieve a higher imaging performance. Specifically, a narrower range of resolution for each beamlet of the plurality of beamlets is achieved. With the features and methods described in the embodiments as well as combinations thereof, each beamlet of the plurality of beamlets is provided with beamlet diameters for example in a span from 2 nm to 2.1 nm with an average resolution of 2.05 nm, and the range of resolution achieved by the features and methods of the embodiments is below 0.15% of the average resolution, such as 0.1%, for example 0.05%.

The disclosure is not limited to the embodiments described above. The embodiments can be fully or partly combined with one another. As can be seen from the above explanations, numerous variations and modifications are possible, and it is evident that the scope of the present application is not limited by the specific embodiments.

Despite the improvements are described at the example of multi-beam charged particle microscopes, the improvements are not limited to multi-beam charged particle microscopes, but also applicable to other multi-beam charged particle systems such as multi-beam lithography systems.

Throughout the embodiments, electrons are to be understood as charged particles in general. While some embodiments are explained at the example of electrons, they shall not be limited to electrons but well applicable to all kinds of charged particles, such as for example Helium or Neon-Ions.

A list of reference numbers is provided:

1 charged particle system
3 illumination system
5 set of beamlets of charged particles
7 image plane
9 sample
11 imaging system
13 spatially resolving charged particle detector
15 set of beamlets of secondary charged particles
17 object plane
19 detector plane
21 source unit
22 a charged particle emitter
23 diverging beam of charged particles
25 condenser system
27 multi-beam generating unit
29 intermediate focus surface
31 plurality of focus points
33 imaging element
35 imaging system
37 Objective system
39 imaging element
41 multi-beam deflector unit
43 operation unit
45 multi-beam raster control unit
47 local control unit
49 image processing unit
51 control unit
65 beam splitting and combining unit
67 global deflection unit
69 imaging element
70 incident electron beam
71 multi-beam raster unit
73.1, 73.2, 73.3, 73.5 multi-aperture plates
74 beam entrance or upper side
75.1, 75.2, 75.3 set of openings or apertures
77, 77.1, 77.2 multiple electron beamlets
79 ring-shaped electrode
80 electrostatic lens element
81.1, 81.2 electrodes
82 electrode
83.1, 83.2, 83.3 spacers
84 planar element
85 aperture
87 inner wall
89 outer contour of an aperture
91 ideal circular shape
93 deviations of the electrostatic field
95 scattered electron trajectory
97 electron beam trajectory
99 absorbing and conductive layer
101.1, 101.2, 101.3 segments of a first multi-aperture plate
102.1, 102.2, 102.3 segments of a second multi-aperture plate
103 tangent vector in x-z-plane
105 symmetry axis of an aperture
107 bottom side or beam exiting side
108 layer of a conductive material 109 etch stop ring
111 fixation or attachment points
114 electrode
115.1, 115.2 adjusting elements
117 first layer of supporting structure
119 second layer of supporting structure
121 support zone
123 inner zone or membrane zone
125 structures with the form of a segment of a sphere
127 through holes
129.1, 129.2, 129.3 layers
131 etch stop mask
133 circular openings
135.1, 135.2, 135.3 layers
137 first etch stop layer
139 second etch stop layer
141 circular opening
143 circular opening
151.1, 151.2, . . . , 151.5 multi-aperture plates
153 support unit
155.1, 155.2, 155.3, 155.4 alignment axes
157 plurality of apertures
160 abatement or lowering
161 deformed membrane of the second multi-aperture plate
163 SiN-coating
165 Capacitive sensors
169 actuators
171 membrane of first multi-aperture plate
173 beam entrance or upper surface of the second multi-aperture plate
175 electrical wiring
177 conductive shielding layer
179 isolation material
181 isolation gap
183 bulk material
185 isolation gap
187 scattered particle
189 extension
195 plurality of apertures
197 support zone
199 membrane zone
201 high voltage wiring connection
203 ground line
205 coaxial shielding and isolation
207 low voltage wiring connection
209 low voltage wiring connection
211 ASIC
215 ASIC
217.1, 217.2 digital signal line
219.1, 219.2 low voltage supply line
305 etch stop or isolation layer
309 isolating gaps
311 isolation layer
313 etch stop or isolation layer

What is claimed is:

1. A multi-beam raster unit configured to transmit beamlets of charged particles, the multi-beam raster unit comprising:

a first multi-aperture plate comprising a beam exit side, a beam entrance side and a first membrane, the first membrane comprising a first thickness and a plurality of first apertures, the first membrane comprising a first segment having a first segment thickness and a plurality of cylindrical apertures having a first diameter at the beam entrance side of the first multi-aperture plate, the first membrane comprising a second segment having a plurality of apertures having a second diameter at the beam exit side of the first multi-aperture plate, the first membrane comprising a first electrode proximal to a first aperture at the beam exit side of the first multi-aperture plate;

a second multi-aperture plate comprising a beam entrance side and a second membrane, the second membrane comprising a plurality of second apertures having a third diameter at the beam entrance side of the second multi-aperture plate, the first and second multi-aperture plates configured to have a gap therebetween; and a plurality of second electrodes proximal to the plurality of second apertures at the beam entrance side of the second multi-aperture plate, wherein:

the second diameter is greater than the first diameter;

a thickness of the gap is a distance from the beam exit side of the first multi-aperture plate to the beam entrance side of the second multi-aperture plate;

the second diameter is in a range between the thickness of the gap and two times the thickness of the gap;

the first segment thickness is less than 10 μm; and the first electrode and each of the plurality of second electrodes are configured to provide electrostatic elements to provide an electrostatic field between the first electrode and each of the plurality of second electrodes to influence the beamlets of charged particles.

2. The multi-beam raster unit of claim 1, wherein an inner sidewall surface of at least one aperture of the plurality of apertures of the second segment has a surface shape sloping away from a beamlet of charged particles.

3. The multi-beam raster unit of claim 2, wherein the surface shape is curved in a direction in which the beamlet of charged particles is transmitted through the first membrane.

4. The multi-beam raster unit of claim 3, wherein the surface shape is spherical in a direction in which the beamlet of charged particles is transmitted through the first membrane.

5. The multi-beam raster unit of claim 1, wherein an inner sidewall surface of at least one aperture of the plurality of apertures in the second segment continuously increases in a direction in which a beamlet of charged particles is transmitted through the first membrane.

6. The multi-beam raster unit of claim 1, further comprising etch stop rings at a member selected from the group consisting of the apertures at the beam exit side of the first multi-aperture plate and apertures at the beam entrance side of the second multi-aperture plate.

7. The multi-beam raster unit of claim 1, wherein, in a direction in which the beamlets of charged particles are transmitted, the first membrane is upstream of the second membrane.

8. The multi-beam raster unit of claim 1, further comprising a third multi-aperture plate disposed between the first and second multi-aperture plates in a direction in which the beamlets of charged particles are transmitted.

9. The multi-beam raster unit of claim 1, wherein a surface roughness of an inner sidewall surface of at least one aperture of the plurality of apertures in the first segment is less than 50 nm rms.

10. The multi-beam raster unit of claim 1, wherein the second diameter is in a range between the first segment thickness and four times the first segment thickness.

11. The multi-beam raster unit of claim 1, wherein the third diameter is greater than the first diameter.

12. The multi-beam raster unit of claim 1, wherein the third diameter is in a range between the first diameter and the second diameter.

13. The multi-beam raster unit of claim 1, wherein the first multi-aperture plate comprises an absorbing layer on the beam entrance side of the first multi-aperture plate, and the absorbing layer is configured to be connected to ground level.

14. The multi-beam raster unit of claim 1, wherein the first multi-aperture plate comprises a conductive layer on the beam exit side of the first multi-aperture plate, and the conductive layer defines the first electrode.

15. The multi-beam raster unit of claim 1, wherein:

the beam exit side of the first multi-aperture plate comprises a plurality of first electrodes comprising ring-shaped conductive layers or electrodes;

the first electrodes are around or in proximity to the apertures of the second segment; and the first electrodes are configured to be connected to a constant voltage potential.

16. The multi-beam raster unit of claim 1, wherein the beam exit side of the first multi-aperture plate does not comprise a shielding electrode.

17. The multi-beam raster unit of claim 1, wherein:

the second multi-aperture plate comprises ring-shaped electrodes defining the second electrodes;

the second electrodes are disposed around the second apertures; and the second electrodes are configured to have a drive voltage applied thereto.

18. The multi-beam raster unit of claim 17, wherein the ring-shaped electrodes extend through the second multi-aperture plate.

19. The multi-beam raster unit of claim 1, wherein the beam entrance side of the second multi-aperture plate is covered by a shielding layer which comprises a plunging extension into an aperture of the second multi-aperture plate.

20. The multi-beam raster unit of claim 1, wherein:

the second multi-aperture plate comprises a plurality of multiple electrodes defining the second electrodes;

the second electrodes are disposed around the second apertures; and each of the second electrodes is configured to have driving voltages applied thereto, the first electrode and each of the plurality of second electrodes are configured to provide electrostatic elements to provide an electrostatic field between the first electrode and each of the plurality of second electrodes to deflect or correct the beamlets of charged particles.

* * * * *